United States Patent
Madraswala et al.

(10) Patent No.: US 11,402,996 B2
(45) Date of Patent: Aug. 2, 2022

(54) METHODS AND APPARATUS TO PERFORM ERASE-SUSPEND OPERATIONS IN MEMORY DEVICES

(71) Applicant: Intel Corporation, Santa Clara, CA (US)

(72) Inventors: Aliasgar S. Madraswala, Folsom, CA (US); Yogesh B. Wakchaure, Folsom, CA (US); Camila Jaramillo, San Jose, CA (US); Trupti Bemalkhedkar, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 548 days.

(21) Appl. No.: 16/271,572

(22) Filed: Feb. 8, 2019

(65) Prior Publication Data
US 2019/0278488 A1   Sep. 12, 2019

Related U.S. Application Data

(63) Continuation of application No. 15/085,291, filed on Mar. 30, 2016, now Pat. No. 10,203,884.

(51) Int. Cl.
*G06F 3/06* (2006.01)
*G11C 16/22* (2006.01)
*G11C 16/14* (2006.01)

(52) U.S. Cl.
CPC .......... *G06F 3/0613* (2013.01); *G06F 3/0634* (2013.01); *G06F 3/0652* (2013.01);
(Continued)

(58) Field of Classification Search
CPC .... G06F 3/0613; G06F 3/0634; G06F 3/0659; G06F 3/0679; G11C 16/225
See application file for complete search history.

(56) References Cited

U.S. PATENT DOCUMENTS

| | | | |
|---|---|---|---|
| 5,675,540 A | 10/1997 | Roohparvar | |
| 6,201,739 B1 ‡ | 3/2001 | Brown | G06F 9/4403 |
| | | | 365/18 |

(Continued)

FOREIGN PATENT DOCUMENTS

| | | | |
|---|---|---|---|
| CN | 1694184 | | 11/2005 |
| CN | 102483951 | | 5/2012 |
| WO | WO-2014100452 | ‡ | 6/2014 |
| WO | 2015073639 | | 5/2015 |

OTHER PUBLICATIONS

United States Patent and Trademark Office, "Non-Final Office Action," issued in connection with U.S. Appl. No. 15/216,097, dated Mar. 5, 2018, 25 pages.‡

(Continued)

*Primary Examiner* — Jane Wei
(74) *Attorney, Agent, or Firm* — Hanley, Flight & Zimmerman, LLC

(57) ABSTRACT

A disclosed example to use an erase-suspend feature on a memory device includes a host interface to receive a first erase command to perform an erase operation; and a control circuit to: based on the erase-suspend feature being enabled at the memory device, suspend the erase operation based on determining that a length of time equal to an erase segment duration value has elapsed, the length of time elapsed being relative to a start of an erase segment, and the erase segment duration value specified in a configuration parameter for the erase-suspend feature; perform a second memory operation when the erase operation is suspended; and after the second memory operation is complete, resume the erase operation based on receiving a second erase command from the memory host controller.

22 Claims, 11 Drawing Sheets

(52) U.S. Cl.
CPC .......... *G06F 3/0659* (2013.01); *G06F 3/0679* (2013.01); *G11C 16/225* (2013.01); *G11C 16/14* (2013.01)

(56) References Cited

U.S. PATENT DOCUMENTS

| | | | | |
|---|---|---|---|---|
| 6,633,950 | B1 ‡ | 10/2003 | Brown | G06F 9/4403 711/10 |
| 7,110,301 | B2 | 9/2006 | Lee et al. | |
| 7,711,918 | B2 ‡ | 5/2010 | Kim | G11C 16/32 711/10 |
| 7,961,517 | B2 ‡ | 6/2011 | Aritome | G11C 16/102 365/18 |
| 8,850,103 | B2 | 9/2014 | Bennett | |
| 10,203,884 | B2 | 2/2019 | Madraswala et al. | |
| 2002/0188812 | A1 ‡ | 12/2002 | Sadhasivan | G06F 13/4239 711/15 |
| 2007/0047315 | A1* | 3/2007 | Aritome | G11C 16/102 365/185.18 |
| 2007/0198768 | A1 ‡ | 8/2007 | Kim | G11C 16/32 711/10 |
| 2012/0117317 | A1* | 5/2012 | Sheffler | G11C 7/22 711/103 |
| 2012/0167100 | A1 ‡ | 6/2012 | Li | G11C 16/102 718/10 |
| 2012/0213005 | A1 | 8/2012 | Lee | |
| 2013/0198451 | A1 ‡ | 8/2013 | Hyun | G06F 3/0652 711/114 |
| 2014/0281213 | A1 ‡ | 9/2014 | Dinallo | G06F 3/0616 711/11 |
| 2014/0293704 | A1 ‡ | 10/2014 | Ghalam | G11C 16/30 365/185.18 |
| 2015/0055419 | A1 | 2/2015 | Iwasaki et al. | |
| 2015/0221381 | A1 ‡ | 8/2015 | Nam | G11C 16/14 365/18 |
| 2015/0248922 | A1 | 9/2015 | Hyun et al. | |
| 2016/0163397 | A1 ‡ | 6/2016 | Sehgal | G11C 16/349 365/18 |
| 2016/0210050 | A1* | 7/2016 | Hyun | G06F 3/0611 |
| 2018/0024772 | A1 ‡ | 1/2018 | Madraswala | G06F 3/0659 711/10 |

OTHER PUBLICATIONS

Patent Cooperation Treaty, "International Search Report," issued in connection with International Patent Application No. PCT/US2017/015381, dated Apr. 26, 2017, 3 pages.‡

Patent Cooperation Treaty, "Written Opinion," issued in connection with International Patent Application No. PCT/US2017/015381, dated Apr. 26, 2017, 12 pages.‡

United States Patent and Trademark Office, "Non-Final Office Action," issued in connection with U.S. Appl. No. 15/216,097, dated Apr. 14, 2017, 15 pages.‡

United States Patent and Trademark Office, "Advisory Action," issued in connection with U.S. Appl. No. 15/216,097, dated Nov. 16, 2017, 3 pages.‡

United States Patent and Trademark Office, "Final Office Action," issued in connection with U.S. Appl. No. 15/216,097, dated Sep. 22, 2017, 21 pages.‡

United States Patent and Trademark Office, "Final Office Action," issued in connection with U.S. Appl. No. 15/216,097, dated Aug. 31, 2018, 29 pages.‡

United States Patent and Trademark Office, "Advisory Action," issued in connection with U.S. Appl. No. 15/216,097, dated Nov. 8, 2018, 3 pages.‡

United States Patent and Trademark Office, "Office Action," dated Nov. 3, 2017 in connection with U.S. Appl. No. 15/085,291 (15 pages).

United States Patent and Trademark Office, "Office Action," dated Mar. 30, 2018 in connection with U.S. Appl. No. 15/085,291 (15 pages).

United States Patent and Trademark Office, "Office Action," dated Jan. 4, 2019 in connection with U.S. Appl. No. 15/216,097 (28 pages).

European Patent Office, "Extended European Search Report," dated Nov. 4, 2019 in connection with European Patent Application No. 17776058.4 (8 pages).

United States Patent and Trademark Office, "Advisory Action," dated Aug. 8, 2018 in connection with U.S. Appl. No. 15/085,291 (3 pages).

United States Patent and Trademark Office, "Notice of Allowance," dated Sep. 25, 2018 in connection with U.S. Appl. No. 15/085,291 (9 pages).

United States Patent and Trademark Office, "Notice of Allowance," dated Aug. 14, 2019 in connection with U.S. Appl. No. 15/216,097 (8 pages).

European Patent Office, "Summons to Attend Oral Proceedings," issued Feb. 14, 2022 in connection with European Patent Application No. 17776058.4, 9 pages.

European Patent Office, "Communication Pursuant to Article 94(3) EPC," dated Dec. 3, 2020 in connection with European Patent Application No. 17776058.4, 7 pages.

* cited by examiner
‡ imported from a related application

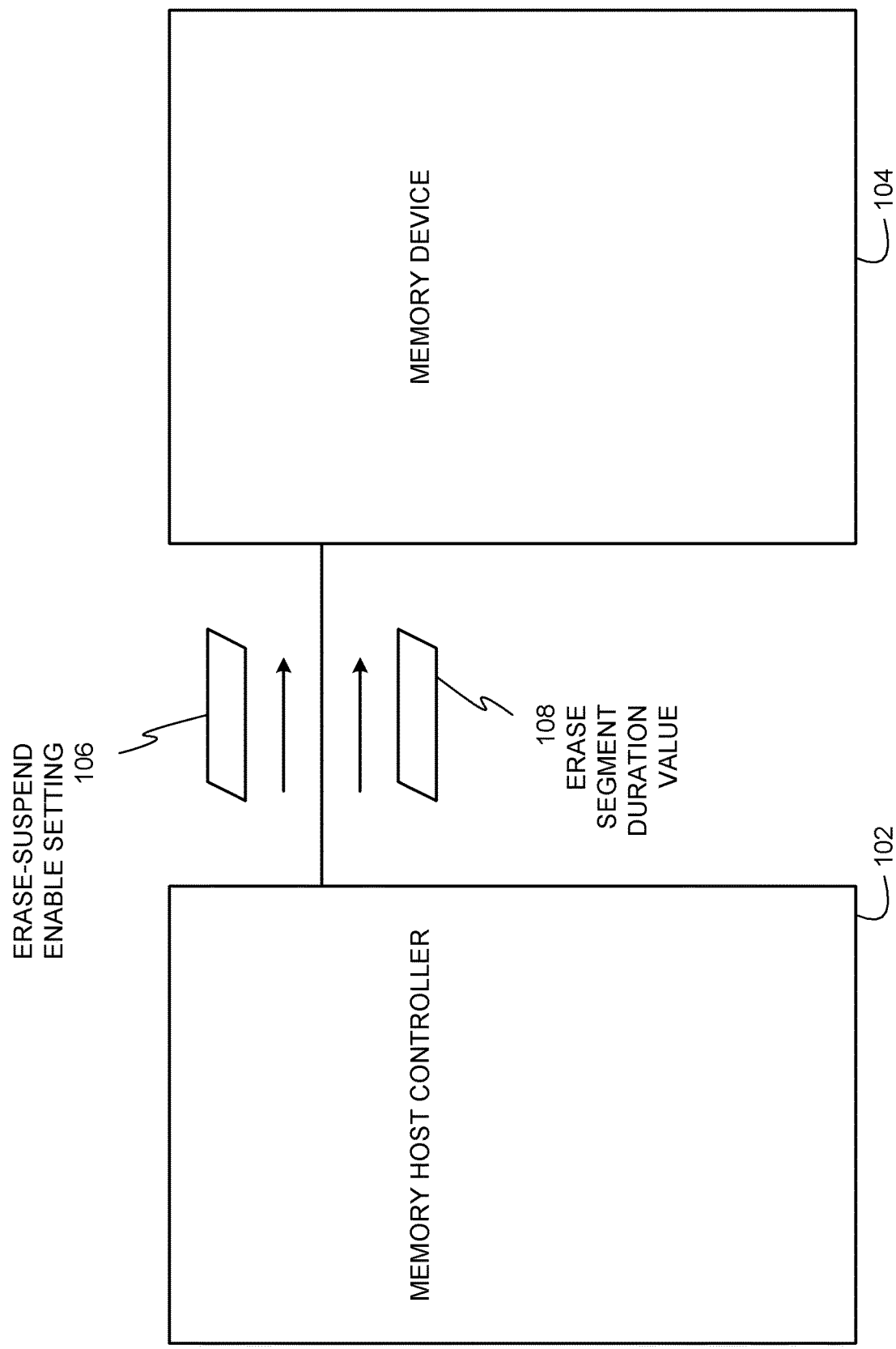

| OPERATION | EXPECTED BEHAVIOR |
|---|---|
| Read page, change read column | Valid |
| Read cache sequential | Valid |
| Read cache random | Valid |
| Read cache last | Valid |
| Reedy retry/MRR/corrective read | Valid |
| Set/get feature | Valid |
| MLBi, eMLBi | Valid |
| Soft read (SBR), channel calibration (CC), single bit SBR (SBSBR) | Valid |
| Program | Valid |
| Cachew program | Valid |
| Erase on a different block address than is auto erase-suspended | Invalid |
| Erase Suspend and Resume | Invalid |
| Program on auto erase-suspended block | Invalid |
| Read on auto erase-suspended block | Invalid data |
| Reset (FF, FA, FC) | Erase operation that was auto erase-suspended is canceled and status is cleared |

OPERATIONS VALIDITY TABLE

FIG. 4

| DESCRIPTION | SR[7] | SR[6] | SR[2] | SR[0] |
|---|---|---|---|---|
| Device busy | x | 0 | x | x |
| Erase operation auto erase-suspended successfully | 1 | 1 | 1 | 0 |
| Erase operation completed with pass status | 1 | 1 | 0 | 0 |
| Erase operation completed with fail status | 1 | 1 | 0 | 1 |
| If memory host controller requests write/program operation on a suspended block or an erase operation on a different block while auto-suspended, command is not accepted. Memory device remains in auto erase suspended state (see FIG. 4 for invalid program and erase operations). | 0 | 1 | X (Invalid) | 0 |
| Invalid status | 0 | 1 | 0 | 1 |
| Invalid status | 0 | 1 | 1 | 1 |
| Invalid status | 1 | 1 | 1 | 1 |

STATUS REGISTER BITS FOR AUTO ERASE-SUSPEND STATUSES

METHODS AND APPARATUS TO PERFORM ERASE-SUSPEND OPERATIONS IN MEMORY DEVICES

RELATED APPLICATIONS

This patent arises from a continuation of U.S. patent application Ser. No. 15/085,291, filed Mar. 30, 2016, and entitled "Methods and Apparatus to Perform Erase-Suspend Operations in Memory Devices." U.S. patent application Ser. No. 15/085,291 is hereby incorporated herein by reference in its entirety.

FIELD OF THE DISCLOSURE

The present disclosure relates generally to memory devices and, more particularly, to methods and apparatuses to perform erase-suspend operations in memory devices.

BACKGROUND

Nonvolatile memory devices are capable of storing data for extended periods of time without needing to be powered to maintain such data storage. Information is written to a solid state memory device, such as a flash memory device, by changing the electrical characteristics of transistor-based memory cells to change how such memory cells react to applied voltages. The electrical characteristics of different memory cells in a solid state memory device are representative of binary bits that can be read by sensing output voltages of the memory cells in response to applied input voltages.

When data is to be erased or overwritten in a flash memory device, an erase command is issued to the flash memory device by a memory host controller. To perform an erase operation, the flash memory device must generate large voltages to apply to the target memory cells to be erased. In addition, the voltages must be applied to the target memory cells over a particular duration to ensure that the electrical characteristics of the memory cells are changed to reflect an erased state. Such voltage generation and voltage application require a significant amount of time that makes an erase operation longer than other memory access operations.

BRIEF DESCRIPTION OF THE DRAWINGS

FIG. 1A is an example memory host controller in circuit with an example memory device that may be used to perform auto erase-suspend operations in accordance with the teachings of this disclosure.

FIG. 4 is an example operations validity table.

FIG. 5 is an example status register bits table showing memory device statuses associated with auto erase-suspend operations.

The figures are not to scale. Wherever possible, the same reference numbers will be used throughout the drawing(s) and accompanying written description to refer to the same or like parts.

DETAILED DESCRIPTION

Figure 1B:
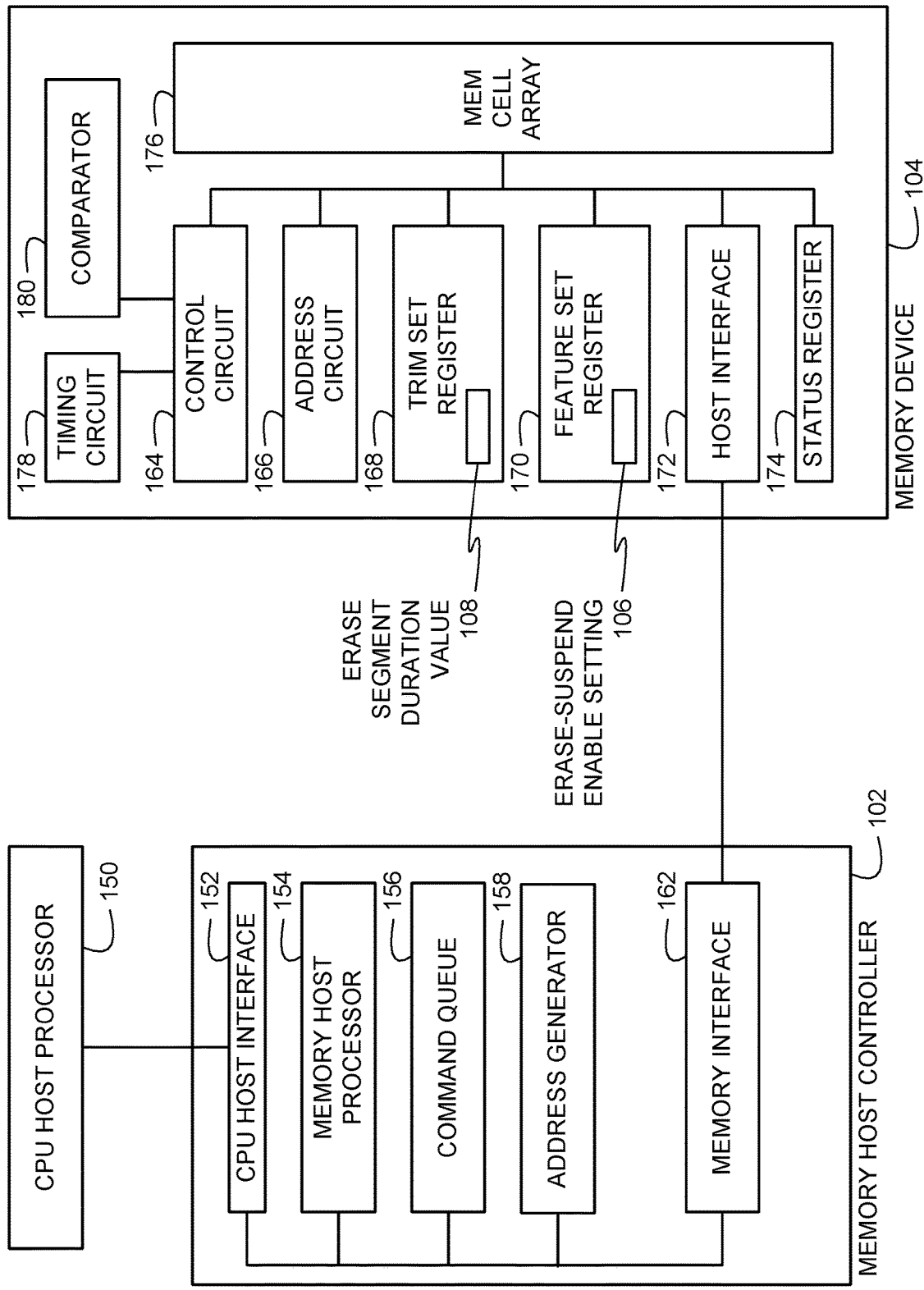
FIG. 1B is an example configuration that may be used to implement the example memory host controller and the example memory device of FIG. 1A to perform auto erase-suspend operations in accordance with the teachings of this disclosure.

Examples disclosed herein may be used to perform erase-suspend operations in memory devices. Examples disclosed herein enable memory devices to implement erase-suspend operations in an automatic manner (e.g., auto erase-suspend operations) by programming the memory devices to suspend erase operations before the erase operations complete. By suspending an erase operation before its completion, one or more other memory operations requested by a memory host controller can be performed by the memory device without the memory host controller needing to wait for the memory device to complete the erase operation before the memory host controller can request the memory device to perform another memory operation. In this manner, examples disclosed herein can significantly increase throughput of memory devices by allowing other memory operations to be performed without needing to stall those memory operations until completion of an ongoing erase operation. For example, some NAND memory devices have an erase operation time of 10 milliseconds (ms). If the memory host controller requires a read or a write operation to be performed on a NAND memory device that is busy with an erase operation, then the erase operation time becomes visible to the host. That is, the erase operation time affects the operation of the memory host controller because the memory host controller must delay when it sends additional commands to the NAND memory device due to having to wait for the duration of the erase operation time (e.g., 10 ms).

An erase operation time required by a memory device can be significantly lengthy compared to other memory operations. For example, in a NAND memory device, a read operation is faster than an erase operation. In some instances, some memory operations are faster than others because they consume fewer resources in a memory device than more lengthy memory operations. As such, to increase throughput of memory operations that are faster and require less resources of a memory device, example auto erase-suspend techniques disclosed herein enable inserting such faster memory operations (e.g., read operations) in the memory device during an ongoing erase operation without needing to wait until the memory device completely finishes the erase operation. That is, examples disclosed herein enable a memory device to operate autonomously to suspend an ongoing erase operation before the erase operation completes and to allow other memory operations to be requested by a memory host controller and to be performed by the memory device while the ongoing erase operation is suspended.

Examples disclosed herein are useful to prioritize host read operations over other operations to, for example, maximize host-to-memory interface bandwidth as permitted by a host workload ratio. For example, a host workload ratio specifies a number of other memory operations, such as read operations, performed relative to a number of erase operations.

Although some examples disclosed herein are described in connection with NAND memory devices, examples disclosed herein may be used in connection with any other types of memory devices including any suitable type of nonvolatile memory (e.g., NOR flash memory, magnetic disk memory, etc.) or volatile memory.

FIG. 1A is an example memory host controller 102 in circuit with an example memory device 104 that may be used to perform auto erase-suspend operations in accordance with the teachings of this disclosure. The example memory host controller 102 is in circuit with the example memory device 104 via one or more buses such as a data bus, an address bus and/or control signals. The memory host controller 102 of the illustrated example controls memory operations performed by the memory device 104. For example, the memory host controller 102 can send commands to the memory device 104 to cause the memory device 104 to perform memory operations such as read operations, write operations, erase operations, etc. In addition, the example memory host controller 102 sends information to be written to the memory device 104 and receives information read from the memory device 104. The memory device 104 of the illustrated example stores information such as data and/or instructions. The example memory device 104 may be any type of memory device suitable for implementing examples disclosed herein.

To use an auto erase-suspend feature on the example memory device 104, the example memory host controller 102 programs the example memory device 104 to enable the auto erase-suspend feature. In some examples, the memory host controller 102 can program the memory device 104 during a power-up phase (e.g., a power up of the memory host controller 102 and/or of the memory device 104). For example, the memory host controller 102 can be configured (e.g., with a register setting or by receiving a command from a CPU host processor) to program the memory device 104 during the power-up phase to either enable or disable the auto erase-suspend feature in the memory device 104. Additionally or alternatively, the example memory host controller 102 can program the auto erase-suspend feature in the example memory device 104 at any time during operation of the example memory device 104. For example, the memory host controller 102 can determine to enable or disable the auto erase-suspend feature before sending an erase command to the memory device 104 based on whether other memory commands are awaiting (e.g., in a command queue) to be processed by the memory host controller 102.

In the illustrated example, to enable the auto erase-suspend feature, the memory host controller 102 sends an example erase-suspend enable setting 106 and an example erase segment duration value 108 to the example memory device 104. The example erase-suspend enable setting 106 configures the memory device 104 to perform an erase operation as a plurality of erase segments (e.g., erase operation segments) and to suspend the erase operation between the erase segments. The example erase segment duration value 108 specifies a length of time for which the memory device 104 is to perform a portion of the erase operation before suspending the erase operation.

In the illustrated example, after the memory host controller 102 programs the memory device 104 with the erase-suspend enable setting 106 to enable the auto erase-suspend feature and with the erase segment duration value 108, the memory host controller 102 may initiate an erase operation to be performed at the memory device 104. For example, the memory host controller 102 may receive an erase request from a CPU host processor requesting a specified address or address range to be erased, and may send a corresponding erase command to the memory device 104. In response to receiving the erase command from the memory host controller 102, the memory device 104 performs an erase operation in accordance with the auto erase-suspend feature and the erase segment duration value 108. For example, the memory device 104 performs the erase operation as a plurality of erase segments having durations equal to the erase segment duration value 108 by suspending the erase operation between the erase segments.

After performing a portion of the erase operation during a first erase segment, the memory device 104 suspends the erase operation on a memory block being erased (e.g., a suspended memory block). When the erase operation is suspended, the memory host controller 102 initiates another memory operation to be performed at the memory device 104. For example, the memory host controller 102 may receive a read request from a CPU host processor, and send a corresponding read command to the memory device 104 while the erase operation is suspended.

After the memory host controller 102 determines that the other memory operation is complete, the memory host controller 102 initiates resumption of the erase operation. For example, the memory host controller 102 may send another erase command to the memory device 104 to resume the erase operation. In the illustrated example, the memory device 104 resumes the erase operation by proceeding to continue erasing the same memory block that was previously suspended (e.g., the suspended memory block). In examples disclosed herein, a complete erase operation involves erasing one memory block. That is, one memory block is erased per erase operation. Depending on the erase segment duration value 108, the memory device 104 may segment the erase operation into more than two erase segments and may suspend the erase operation a number of times.

FIG. 1B is an example configuration that may be used to implement the example memory host controller 102 and the example memory device 104 of FIG. 1A to perform auto erase-suspend operations. In the illustrated example, the memory device 104 is implemented using any memory device such as, but not limited to, any or a combination of: volatile or non-volatile memory. In some examples, the memory device 104 is a dynamic volatile memory that includes DRAM (dynamic random access memory), or some variant such as synchronous DRAM (SDRAM). In some examples, the memory device 104 is a block addressable memory device, such as planar or 3D NAND or NOR technologies. Thus, the example memory device 104 can also include a future generation nonvolatile device, such as a three dimensional crosspoint memory device, or any other byte addressable nonvolatile memory device, or memory device that uses a chalcogenide phase change material (e.g., chalcogenide glass). In some examples, the memory device 104 can be or include multi-threshold level NAND flash memory, NOR flash memory, single or multi-level Phase Change Memory (PCM), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory. However, the example memory device 104 may be implemented using any other suitable type of memory device to implement auto erase-suspend operations as disclosed herein. In the illustrated example, the memory host controller 102 is in circuit with an example central processing unit (CPU) host processor 150. The example CPU host processor 150 sends memory access requests to the memory host controller 102. For example, the CPU host processor 150 may execute one or more software or firmware programs that require reading information from the memory 104, writing information to the memory 104, erasing information in the memory 104, etc.

In the illustrated example, the memory host controller 102 includes an example CPU host interface 152, an example memory host processor 154, an example command queue 156, an example address generator 158, and an example memory interface 162. Also in the illustrated example, the memory device 104 includes an example control circuit 164, an example address circuit 166, an example trim set register 168, an example feature set register 170, an example host interface 172, an example status register 174, an example memory cell array 176, an example timing circuit 178, and an example comparator 180.

In the illustrated example, the CPU host interface 152 is provided to communicatively couple the memory host controller 102 to the CPU host processor 150. In some examples, a permanent connection is maintained between the memory host controller 102 and the CPU host processor 150 via the CPU host interface 152. In other examples, the memory host controller 102 is removably connected to the CPU host processor 150 via the CPU host interface 152. For example, the memory host controller 102 and the memory 104 may be used to implement a memory card, a USB flash drive, a solid-state drive (SSD), and/or any other type of storage device that may be removably connected to a host system via any suitable wired interface such as, for example, a universal serial bus (USB) interface, a memory card interface, a serial advanced technology attachment (SATA) interface, a parallel advanced technology attachment (PATA) interface, and integrated drive electronics (IDE) interface, an IEEE 1394 (FireWire) interface, etc. In some examples, the memory host controller 102 may be removably connected to the CPU host processor 150 via a wireless interface (e.g., a Bluetooth interface, a Wi-Fi interface, etc.). In such examples, the CPU host interface 152 may be in circuit with a radio (e.g., a Bluetooth radio, a Wi-Fi radio, etc.) to perform the wireless communications between the memory host controller 102 and the CPU host processor 150. In some examples, the memory host controller 102 can be formed in the same integrated circuit or device as that of the CPU host processor 150.

The memory host processor 154 of the illustrated example is provided to control the operations of the memory host controller 102. For example, the memory host processor 154 can determine when to program the memory 104 to enable the auto erase-suspend feature. In some examples, the memory host processor 154 programs the memory 104 during a power-up phase to enable the auto erase-suspend feature. Additionally or alternatively, the memory host processor 154 can program the memory 104 at any time during operation of the memory 104 to enable or disable the auto erase-suspend feature. For example, before sending an erase command to the memory 104, the memory host controller 102 may determine whether the memory 104 should use the auto erase-suspend feature when performing the erase operation. In some examples, the memory host processor 154 determines whether to change the auto erase-suspend feature in the memory 104 between the erase-suspend feature being disabled and the erase-suspend feature being enabled based on a number of and/or types of memory operation commands pending in the command queue 156. For example, if a number of read commands are queued in the command queue 156, the memory host processor 154 may determine to enable the auto erase-suspend feature in the memory 104 before initiating an erase command to process the read commands during the erase operation.

In some examples, the memory host processor 154 also determines the duration for the erase segment duration value 108 to control how much time is to elapse before the memory device 104 suspends an erase operation. For example, the erase segment duration value 108 may be specified by the CPU host processor 150 or may be determined by the memory host processor 154 based on the number of and/or types of other memory commands pending in the command queue 156. The example memory host processor 154 may also determine the status of the memory 104 to determine, for example, when the memory 104 has auto-suspended an erase operation based on the auto erase-suspend feature. In this manner, the example memory host processor 154 can determine when the memory host controller 102 can send another memory command to the memory 104 while an ongoing erase operation is suspended.

The command queue 156 of the illustrated example is provided to the memory host controller 102 to store memory operation commands to be sent by the memory host controller 102 to the memory 104. For example, the memory host controller 102 may receive memory operation requests from the CPU host processor 150. To service the memory operation requests, the memory host controller 102 stores corresponding memory operation commands in the command queue 156.

The address generator 158 of the illustrated example is provided to the memory host controller 102 to generate physical addresses of the memory 104 corresponding to the memory access requests received from the CPU host processor 150. For example, the address generator 158 may generate physical addresses for read requests, write requests, erase requests, etc.

The memory interface 162 of the illustrated example is provided to the memory host controller 102 to interface/communicate with the memory 104. For example, the memory interface 162 may include an address bus, a data bus, and/or control signals (e.g., a chip enable (CE#) line, a write enable (WE#) line, a read enable (RE#) line, a command latch enable (CLE) line, an address latch enable (ALE) line, a write protect (WP#) line, a read/busy (R/B#) line, etc.).

The control circuit 164 of the illustrated example is provided to control operations of the memory 104. The address circuit 166 of the illustrated example is provided to the memory 104 to decode physical addresses provided by the memory host controller 102 into column addresses and row addresses of memory cells in the memory cell array 176. For example, the address circuit 166 may include an address register to store the physical addresses from the memory host controller 102. The example address circuit 166 may also include a row address latch to select word lines in the memory cell array 176 and a column address latch to select bit lines in the memory cell array 176. In this manner, the address circuit 166 can enable target memory cells to be accessed in the memory cell array 176 based on the physical addresses.

The trim set register 168 and the feature set register 170 of the illustrated example are provided to the memory 104 to store configuration parameters for different aspects of the memory 104. In the illustrated example, the trim set register 168 is implemented in static random access memory (SRAM), and the feature set register 170 is implemented in a latch. An SRAM is typically less flexible for writing than a latch due to an SRAM memory cell having less transistors (6 transistors per bit) to provide its bit storage capabilities relative to a latch (10 transistors per bit). As such, in some examples, writes to the trim set register 168 can be more limited (e.g., may be accessed less frequently and/or for more limited purposes) than writes to the feature set register 168.

In the illustrated example of FIG. 1B, the trim set register 168 stores the erase segment duration value 108 of FIG. 1A, and the feature set register 170 stores the erase-suspend enable setting 106 of FIG. 1A because the erase segment duration value 108 is changed less frequently than the erase-suspend enable setting 106. However, in other examples other configurations may be used to store the erase segment duration value 108 and the erase-suspend enable setting 106. For example, the erase-suspend enable setting 106 and the erase segment duration value 108 may both be stored in the trim set register 168, or may both be stored in the feature set register 170.

The host interface 172 of the illustrated example is provided to the memory 104 to communicatively couple the memory 104 to the memory host controller 102. For example, the host interface 172 of the memory 104 is in circuit with the memory interface 162 of the memory host controller 102. As such, the host interface 172 is provided with an address bus, a data bus, and/or control signals to interface/communicate with the memory interface 162 of the memory host controller 102. The status register 174 of the illustrated example is provided to the memory 104 to store status information of the memory 104. For example, the status register 174 stores a status of auto erase-suspend operations. The example host interface 172 can receive status requests from the memory host controller 102, and return status bits (e.g., SR[7]-SR[0]) of the status register 174 to the memory host controller 102 in response to the status requests. In this manner, the example memory host controller 102 can determine when an erase operation is suspended and when an erase operation is completed. The memory cell array 176 of the illustrated example includes an array of memory cells that store information based on write requests from the memory host controller 102.

The example timing circuit 178 of the illustrated example is provided to the memory 104 to track elapsed lengths of time during the erase operation to facilitate determining when the erase segment duration value 108 has been satisfied. The example comparator 180 of the illustrated example is provided to the memory 104 to compare the erase segment duration value 108 to elapsed lengths of time tracked by the timing circuit 178. The example comparator 180 can output a signal indicating when an elapsed length of time tracked by the timing circuit 178 has satisfied the erase segment duration value 108 (e.g., when the elapsed length of time is greater than or equal to the erase segment duration value 108). In this manner, when the erase-suspend enable setting 106 is set to enable the auto erase-suspend feature in the memory device 104, the example control circuit 164 can determine when to suspend an ongoing erase operation based on the output of the comparator 180.

While an example manner of implementing the memory host controller 102 and the memory device 104 of FIGS. 1A and 1B is illustrated in FIG. 1B, one or more of the elements, processes and/or devices illustrated in FIG. 1B may be combined, divided, re-arranged, omitted, eliminated and/or implemented in any other way. Further, the example CPU host interface 152, the example memory host processor 154, the example command queue 156, the example address generator 158, the example memory interface 162, the example control circuit 164, the example address circuit 166, the example trim set register 168, the example feature set register 170, the example host interface 172, and the example status register 174, the example memory cell array 176, the example timing circuit 178, the example comparator 180 and/or, more generally, the example memory host controller 102 and/or the example memory device 104 of FIGS. 1A and 1B may be implemented by hardware, software, firmware and/or any combination of hardware, software and/or firmware. Thus, for example, any of the example CPU host interface 152, the example memory host processor 154, the example command queue 156, the example address generator 158, the example memory interface 162, the example control circuit 164, the example address circuit 166, the example trim set register 168, the example feature set register 170, the example host interface 172, and the example status register 174, the example memory cell array 176, the example timing circuit 178, the example comparator 180 and/or, more generally, the example memory host controller 102 and/or the example memory device 104 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example CPU host interface 152, the example memory host processor 154, the example command queue 156, the example address generator 158, the example memory interface 162, the example control circuit 164, the example address circuit 166, the example trim set register 168, the example feature set register 170, the example host interface 172, and the example status register 174, the example memory cell array 176, the example timing circuit 178, and/or the example comparator 180 is/are hereby expressly defined to include a tangible computer readable storage device or storage disk such as a memory, a digital versatile disk (DVD), a compact disk (CD), a Blu-ray disk, etc. storing the software and/or firmware. Further still, the example memory host controller 102 and/or the example memory device 104 of FIGS. 1A and 1B may include one or more elements, processes and/or devices in addition to, or instead of, those illustrated in FIG. 1B, and/or may include more than one of any or all of the illustrated elements, processes and devices.

Figure 2:
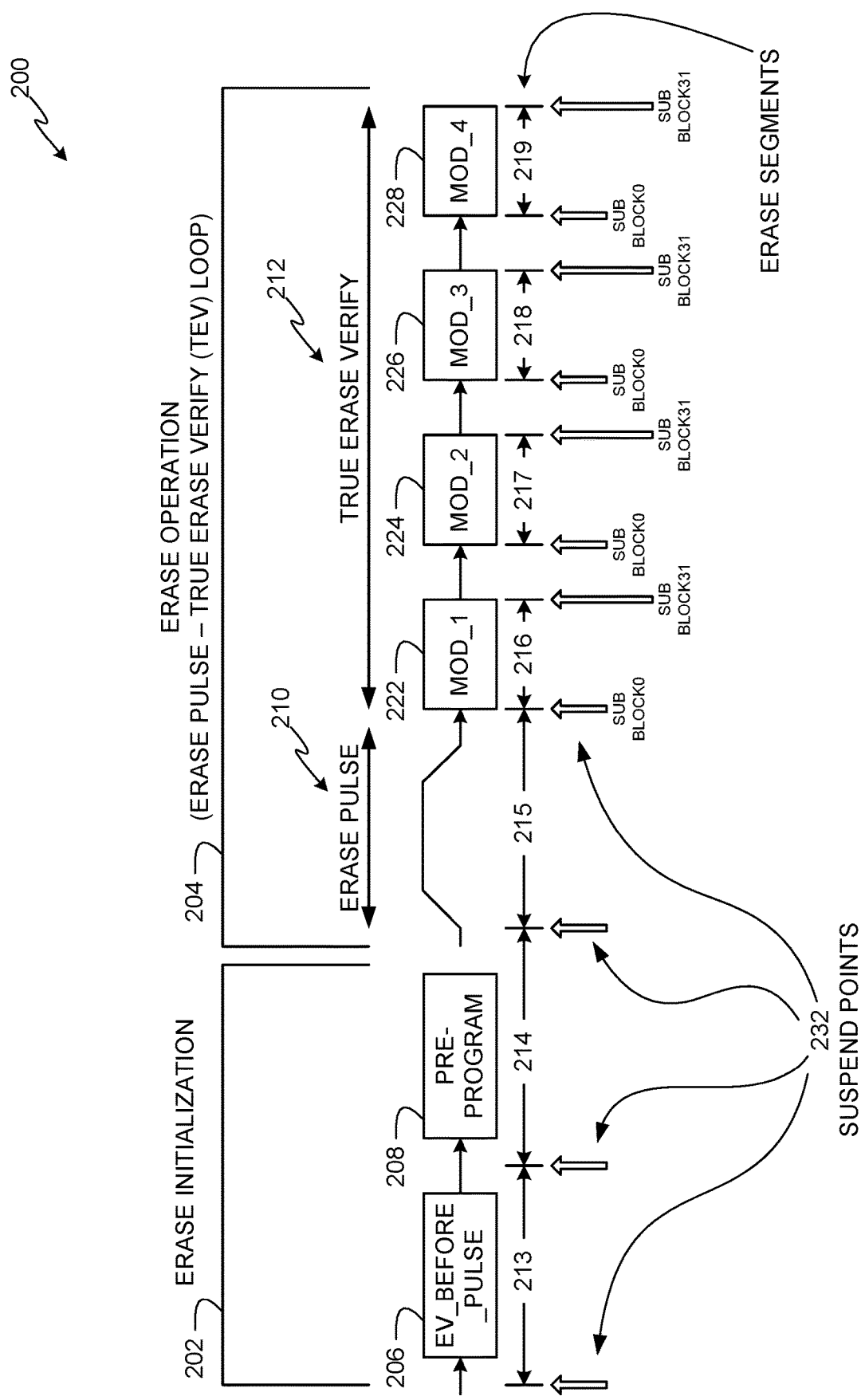
FIG. 2 is an example timeline showing an example auto erase-suspend operation.

FIG. 2 is an example timeline 200 showing an example auto erase-suspend operation performed by the example memory device 104 of FIGS. 1A and 1B. The timeline 200 of the illustrated example includes an example erase initialization phase 202 and an example erase operation phase 204 of a target memory block. The example memory device 104 performs the erase initialization phase 202 and the erase operation phase 204 based on receiving an erase command from the memory host controller 102 when the auto erase-suspend feature is enabled in the memory device 104. In the erase initialization phase 202, the example memory device 104 determines if the target memory block is in an erased state or a programmed state by performing an erase verify operation (EV_BEFORE_PULSE 206) during an erase segment 213 (e.g., an erase operation segment). During pre-program 208 corresponding to an erase segment 214 (e.g., an erase operation segment), the example memory device 104 applies soft-program voltages to the word lines of target memory cells to pre-condition the memory cell array (e.g., the memory cell array 176 of FIG. 1B) to avoid over-erasing.

During the erase operation phase 204, the example control circuit 164 of the memory device 104 generates an erase pulse 210 during an erase segment 215 (e.g., an erase operation segment) to erase the target memory cells of a target memory block to be erased in the memory cell array 176. The example control circuit 164 then controls a true erase verify operation 212 performed on the target memory cells to verify that the erase pulse 210 successfully erased the target memory cells. In the illustrated example, the true erase verify is performed on the target memory block by verifying the word lines of a first ¼ memory block indicated as MOD_1 222 (e.g., a first ¼ of all the word lines of the target memory block), verifying the word lines of a second ¼ memory block indicated as MOD_2 224 (e.g., a second ¼ of all the word lines of the target memory block), verifying the word lines of a third ¼ memory block indicated as MOD_3 226 (e.g., a third ¼ of all the word lines of the target memory block), and verifying the word lines of a fourth ¼ memory block indicated as MOD_4 228 (e.g., a fourth ¼ of all the word lines of the target memory block).

In the illustrated example, the control circuit 164 controls the true erase verify operation 212 by performing the erase verify operation as a plurality of erase segments 216, 217, 218, 219 (e.g., erase operation segments) to verify the erasing of a total number of target memory cells across the example first ¼ memory block 222 (MOD_1) corresponding to the erase segment 216, the example second ¼ memory block 224 (MOD_2) corresponding to the erase segment 217, the example third ¼ memory block (MOD_3) 226 corresponding to the erase segment 218, and the example fourth ¼ memory block 228 (MOD_4) corresponding to the erase segment 219.

A plurality of example suspend points 232 are shown in the timeline 200. When the auto erase-suspend feature is enabled in the memory device 104, the example suspend points 232 are points during the erase initialization phase 202 and the erase operation phase 204 at which the control circuit 164 can suspend an ongoing erase operation if a length of time that has elapsed since a previous suspend point 232 satisfies the erase segment duration value 108 (FIGS. 1A and 1B). For example, the erase segment duration value 108 specifies a length of time that must elapse relative to the start of an erase operation (e.g., the beginning of the erase initialization phase 202) or relative to a most recent auto-suspended state of the erase operation before the memory device 104 can subsequently suspend the ongoing erase operation at one of the suspend points 232. In this manner, the erase segment duration value 108 may be used to define minimum durations of the erase segments 213, 214, 215, 216, 217, 218, 219. In the illustrated example, the control circuit 164 can suspend an ongoing erase operation before generating erase voltages at the EV_BEFORE_PULSE 206, between the EV_BEFORE_PULSE 206 and the pre-program 208, at the start of the erase pulse 210, between the erase pulse 210 and the erase segment 216 corresponding to the first ¼ memory block 222 (MOD_1), between the erase segment 216 corresponding to the first ¼ memory block 222 (MOD_1) and the erase segment 217 corresponding to the second ¼ memory block 224 (MOD_2), between the erase segment 217 corresponding to the second ¼ memory block 224 (MOD_2) and the erase segment 218 corresponding to the third ¼ memory block 226 (MOD_3), between the erase segment 218 corresponding to the third ¼ memory block 226 (MOD_3) and the erase segment 219 corresponding to the fourth ¼ memory block 228 (MOD_4), and after the erase segment 219 corresponding to the fourth ¼ memory block 228 (MOD_4).

In the illustrated example, by suspending an ongoing erase operation at the example suspend points 232, the memory device 104 provides the memory host controller 102 with opportunities to request the memory device 104 to perform other memory operations at the example suspend points 232 before the ongoing erase operation is completed. In this manner, the example memory host controller 102 substantially reduces or eliminates stalling of other memory operations in its command queue 156 (FIG. 1B) from being processed by not having to wait until the erase operation is completed in its entirety in the memory device 104. In the illustrated example, the memory device 104 can resume the ongoing erase operation based on a subsequent erase command received from the memory host controller 102. For example, the memory host controller 102 may send another erase command to the memory device 104 after the memory device 104 has completed another memory operation requested by the memory host controller 102 at the current suspend point 232 and/or when the memory host controller 102 determines that it does not have a memory operation command in its command queue 156 to be performed by the memory device 104.

In some examples, the memory host controller 102 may send one or more other memory operation commands to the memory device 104 during a suspend point 232. In other examples, the memory host controller 102 may not send any memory operation commands to the memory device 104 during a suspend point 232 if no such other memory operation command is waiting in its command queue 156. In any case, the memory host controller 102 sends another erase command to the memory device 104 when the ongoing erase operation is to be resumed. In the illustrated example, the memory host controller 102 sends the subsequent erase command instead of an erase restart command because the subsequent erase command causes the memory device 104 to resume the ongoing erase operation at a suspended memory block at a current suspend point 232 (e.g., resume the erase operation on a subsequent erase segment following a completed erase segment that finished before the suspending of the erase operation). In the illustrated example, an erase restart command is not used by the memory host controller 102 to resume the ongoing erase operation because the erase restart command would cause the memory device 104 to restart the ongoing erase operation from the beginning (e.g., an initial memory block) instead of resuming the ongoing erase operation at a currently suspended memory block.

Figure 3:
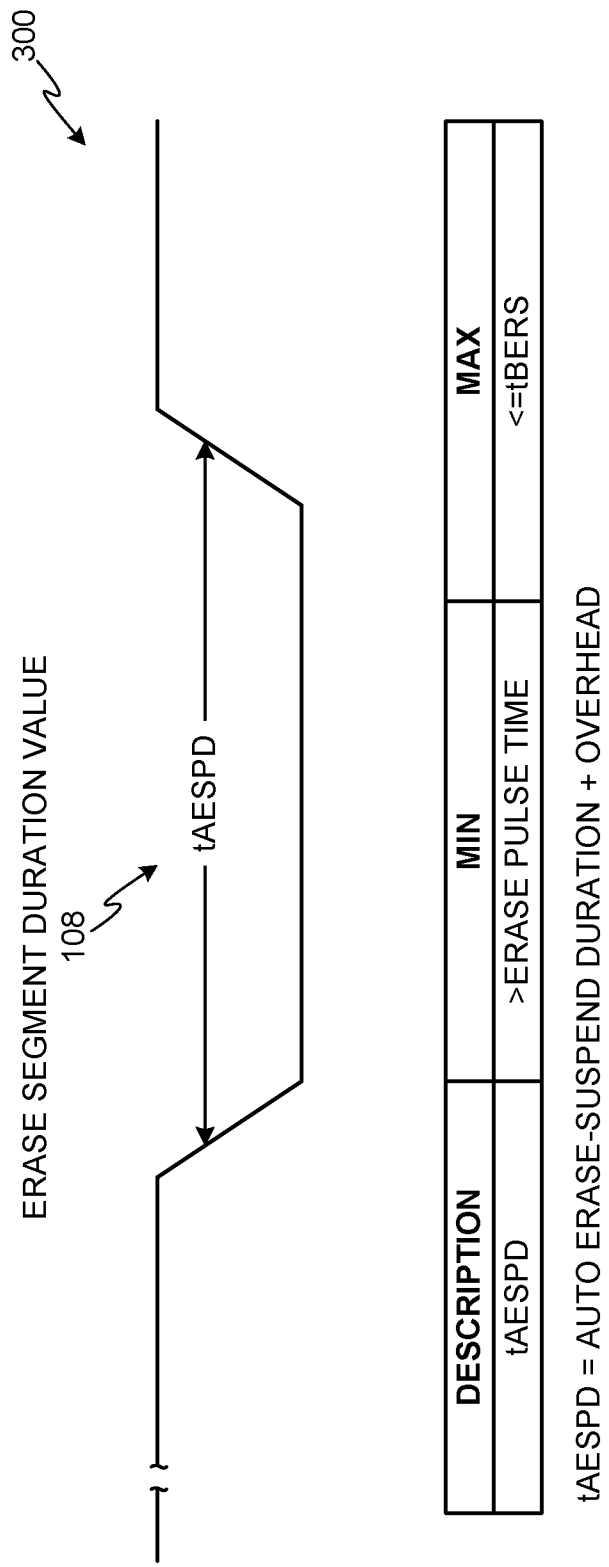
FIG. 3 is a timing diagram of an example erase segment duration value of FIGS. 1A and 1B.

FIG. 3 is a timing diagram 300 for the example erase segment duration value 108 (FIGS. 1A and 1B). In the illustrated example, the erase segment duration value 108 is represented by an auto erase-suspend duration plus overhead time (i.e., tAESPD). In the illustrated example, the overhead time accounts for delays characteristic of the electrical circuits in the memory device 104. Such delays may include propagation delays of signals through the electrical circuits, delays associated with ramping up voltages, delays associated with charging capacitors, etc.

In examples disclosed herein, the erase segment duration value 108 is specified to have a minimum duration that is greater than an erase pulse time of the erase pulse 210 of FIG. 2. In this manner, an ongoing erase operation is not suspended during the erase pulse 210. Suspending an ongoing erase operation during the erase pulse 210 may result in the memory device 104 not properly detecting the erase pulse 210 to start the true erase verify operation 212 of FIG. 2. In examples disclosed herein, the erase segment duration value 108 is specified to have a maximum duration that is less than or equal to a block erase time (i.e., tBERS). For example, a block erase time is the amount of time required for the memory device 104 to erase a single memory address block.

Examples disclosed herein may be used to implement auto erase-suspend operations for single-plane erase operations or multi-plane erase operations. In a single-plane erase operation, the memory device 104 erases a single memory block. In a multi-plane erase operation, the memory device 104 erases multiple memory blocks from different planes simultaneously. For example, the multi-plane erase operation can be used in memory devices that are configured to include multiple planes in which separate operations in the multiple planes can be performed simultaneously.

In the illustrated example FIG. 3, the memory device 104 performs a portion of the erase operation during a length of time equal to the erase segment duration value 108. For example, the memory device 104 may perform an erase verify operation during the erase segment 214 to erase verify the first ¼ memory block 222 (MOD_1) of FIG. 2. When a suspend point 232 (FIG. 2) is reached and the erase segment duration value 108 is satisfied by an elapsed length of time during which the memory device 104 performs the portion of the erase operation, the memory device 104 suspends the erase operation. In some examples, a suspend point 232 is not reached until after the erase segment duration value 108 is satisfied. In such examples, the erase operation is not suspended until some time after the erase segment duration value 108 is satisfied (e.g., when the suspend point 232 is reached after the erase segment duration value 108 is satisfied). When the erase operation is suspended, the memory device 104 performs one or more other memory operations requested by the memory host controller 102 (e.g., specified by one or more other memory operation command(s)). When the one or more other memory operations are complete, the memory host controller 102 sends an erase command to the memory device 104 to resume the erase operation at a suspended memory block.

FIG. 4 is an example operations validity table 400. In examples disclosed herein, the memory device 104 accepts all commands from the memory host controller 102 when the memory device 104 is in an auto erase-suspend state. However, not all commands are valid during the auto erase-suspend state. The example operations validity table 400 shows valid and invalid expected behavior for corresponding operations requested by the memory host controller 102. An example of an invalid operation is a request for an erase on a different block address than a memory block that is currently suspended due to auto erase-suspend. Another example of an invalid operation is that another erase suspend and resume operation cannot be performed by the memory device 104 during a current auto erase-suspend operation. Another example of an invalid operation is that the memory device 104 cannot program/write to an auto erase-suspended block during an auto erase-suspend operation. Yet another example of an invalid operation is that the memory device 104 cannot read valid data on an auto erase-suspended block. The invalid operations shown in FIG. 4 are merely examples. In other examples, one or more such invalid operations may be valid operations.

The example operations validity table 400 also shows a reset operation. In the illustrated example, when the memory host controller 102 sends a reset command to the memory device 104 during an auto erase-suspend operation, the ongoing erase operation that was auto-suspended is canceled and the status of the ongoing erase operation is cleared in the example status register 174 (FIG. 1B).

FIG. 5 is an example status register bits table 500 to indicate memory device statuses associated with auto erase-suspend operations. The example status register bits table 500 shows four status bits, SR[7], SR[6], SR[2], SR[0] of the example status register 174 of FIG. 1B. In the illustrated example, the sixth status register bit (SR[6]) is used to indicate whether the memory device 104 is busy performing a memory operation (e.g., an erase operation, a read operation, a write/program operation, etc.). A value of zero (0) in the example sixth status register bit (SR[6]) indicates that the memory device 104 is busy, and a value of one (1) in the example sixth status register bit (SR[6]) indicates that the memory device 104 is not busy performing a memory operation (i.e., SR[6]=1 means device ready to accept a memory operation command). Examples of values in the other status register bits SR[7], SR[2], SR[0] are shown in connection with the sixth status register bit (SR[6]) being set to one (1), meaning that the memory device 104 is not busy. When the memory device 104 is not busy, it means that the memory device 104 is in a 'device ready' state such that it can receive another command from the memory host controller 102 to perform a corresponding memory operation. Although different values for the seventh, second, and zeroth status register bits SR[7], SR[2], SR[0] are described below in connection with the table of FIG. 5 as indicating particular states of the memory device 104, in examples disclosed herein, the memory device 104 is in the 'device ready' state to receive memory commands based on the sixth status register bit (SR[6]) being set to one (1) regardless of the values of the seventh, second, and zeroth status register bits SR[7], SR[2], SR[0].

The following examples of status register bits SR[7], SR[2], SR[0] are based on the sixth status register bit (SR[6]) being set to one (1) (e.g., the memory device 104 is in a 'device ready' state). In the illustrated example, the seventh status register bit (SR[7]) is a 'write protect' bit. For example, a value of one (1) in the seventh status register bit (SR[7]) indicates that a memory operation command (e.g., a write/program command, an erase command, a read command, etc.) was accepted by the memory device 104. A value of zero (0) in the seventh status register bit (SR[7]) indicates that a memory operation command was not accepted by the memory device 104 and, thus, was not executed. Also in the illustrated example, the second status register bit (SR[2]) indicates when an erase operation has been successfully auto-suspended using the auto erase-suspend feature disclosed herein. Setting the second status register bit (SR[2]) equal to one (1) indicates that the erase operation has been successfully auto-suspended. Clearing the second status register bit (SR[2]) to zero (0) indicates that an erase operation is complete. For example, when an erase operation finishes within an amount of time less than or equal to the erase segment duration value 108 (e.g., the tAESPD of FIG. 3), the memory device cancels an auto erase-suspended operation and clears the value in the second status register bit (SR[2]) to zero. As such, to determine when the memory device 104 can accept new memory operation commands, the memory host controller 102 can check the sixth status register bit (SR[6]) of the status register 174, and to determine when the memory device 104 has successfully auto-suspended an erase operation, the memory host controller 102 can check the second status register bit (SR[2]) of the status register 174.

The zeroth status register bit (SR[0]) indicates whether a fail status exists for an erase operation. For example, when a value of zero (0) is in the zeroth status register bit (SR[0]), the memory device 104 either successfully auto erase-suspended an erase operation or completed an erase operation with a pass status. However, a value of one (1) in the zeroth status register bit (SR[0]) means that an erase operation completed with a fail status.

In the illustrated example, a status of an erase operation that was auto-suspended successfully is represented in the example status register 174 when each of the seventh status register bit (SR[7]), the sixth status register bit (SR[6]), and the second status register bit (SR[2]) is set to one (1), and a zeroth status register bit (SR[0]) is cleared to zero (0). In some examples, the memory host controller 104 may check only for the second status register bit (SR[2]) being set to one (1) to determine that an erase operation was auto-suspended successfully. In the illustrated example, an erase operation completed with a pass status is represented in the example status register 174 when each of the seventh status register bit (SR[7]) and the sixth status register bit (SR[6]) is set to one (1), and when each of the second status register bit (SR[2]) and the zeroth status register bit (SR[0]) is cleared to zero (0). In some examples, the memory host controller 104 may check only for each of the second status register bit (SR[2]) and the zeroth status register bit (SR[0]) being cleared to zero (0) to determine that an erase operation completed successfully.

In the illustrated example, an erase operation completed with a failed status is represented in the example status register 174 when each of the seventh status register bit (SR[7]), the sixth status register bit (SR[6]), and the zeroth status register bit (SR[0]) is set to one (1), and the second status register bit (SR[2]) is cleared to zero (0). In some examples, the memory host controller 104 may check only for the second status register bit (SR[2]) being cleared to zero (0) and the zeroth status register bit (SR[0]) being set to one (1) to determine that an erase operation completed with a failed status. In the illustrated example, a fail status means that the erase operation was not successful at completely erasing the memory cells of a target block of memory. In some examples, any of a number of problems could cause an erase operation to fail, such as circuit issues (e.g., required voltages for the erase operation were not generated), memory cell array defects related to device construction (e.g., bad connections, electrons trapped in memory cells, etc.), and/or memory device firmware bugs (e.g., not setting correct biasing conditions for a memory cell array). In some examples, in response to a fail status, the memory host controller 102 can respond to an erase fail by flagging the failed block(s) (e.g., one or more blocks on which an erase operation failed) as bad, and stop using the block(s) for any subsequent memory operations. In other examples, other manners of handling an erase fail may additionally or alternatively be used.

Also in the illustrated example of FIG. 5, the second status register bit (SR[2]) of the example status register 174 is shown as being invalid when the memory host controller 102 requests a program operation to be performed on a suspended block or requests an erase operation to be performed on a different block than the suspended block while an ongoing erase operation is auto-suspended. When either of such operations is requested, the memory 104 remains in the auto erase-suspended state.

Figure 6:
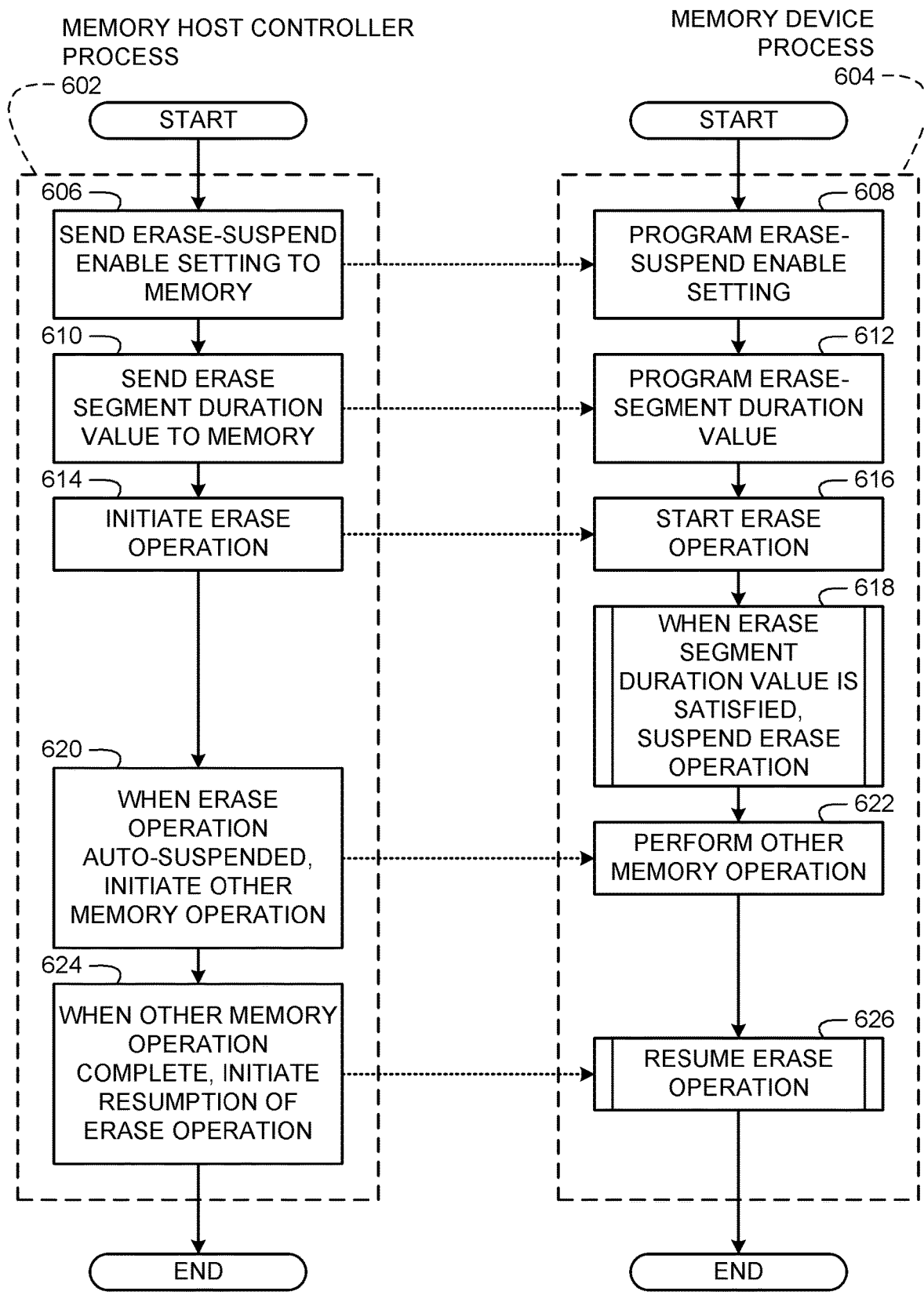
FIG. 6 depicts example flow diagrams representative of machine readable instructions that may be executed to implement the example memory host controller process and the example memory device process of FIGS. 1A and 1B to perform an auto erase-suspend operation in accordance with the teachings of this disclosure.

FIG. 6 depicts example flow diagrams representative of machine readable instructions that may be executed by the memory host controller 102 (FIGS. 1A and 1B) to implement an example memory host controller process 602 and that may be executed by the memory device 104 (FIGS. 1A and 1B) to implement an example memory device process 604 to perform an auto erase-suspend operation in accordance with the teachings of this disclosure. In the example memory host controller process 602, the memory host controller 102 sends the erase-suspend enable setting 106 (FIG. 1A) to the memory device 104 (block 606). For example, the memory host controller 102 sends the erase-suspend enable setting 106 to enable an auto erase-suspend feature in the memory device 104 to cause the memory device 104 to perform an erase operation as a plurality of erase segments (e.g., the erase segments 213, 214, 215, 216, 217, 218, 219 of FIG. 2), and to suspend the erase operation between the erase segments. In the example memory device process 604, the memory device 104 programs the erase-suspend enable setting 106 (block 608). For example, the memory device 104 programs itself with the erase-suspend enable setting 106 to perform auto erase-suspend operations when subsequent erase operations are requested by the memory host controller 102.

In the example memory host controller process 602, the memory host controller 102 sends the erase segment duration value 108 (FIG. 1A) to the memory device 104 (block 610). For example, the memory host controller 102 sends the erase segment duration value 108 to specify a length of time that must elapse before suspending an erase operation. In this manner, the erase segment duration value 108 may be used to define minimum durations of the erase segments 213, 214, 215, 216, 217, 218, 219. In the example memory device process 604, the memory device 104 programs the erase-segment duration value 108 (block 612). For example, the memory device 104 stores the erase-segment duration value 108 for use in determining when to auto-suspend erase operations when the auto erase-suspend feature is enabled by the erase-suspend enable setting 106.

In the example memory host controller process 602, the example memory host controller 102 initiates an erase operation (block 614). For example, the memory host controller 102 can send an erase command to the memory device 104. In the example memory device process 604, the memory device 104 starts and erase operation (block 616). For example, the memory device 104 can start the erase operation based on the erase command received from the memory host controller 102. When the example memory device 104 determines that the erase segment duration value 108 is satisfied, the memory device 104 suspends the erase operation (block 618). For example, the memory device 104 can suspend the erase operation at one of the suspend points 232 (FIG. 2) after the erase segment duration value 108 is satisfied. An example process that can be used to implement block 618 is described below in connection with FIG. 7.

In the example memory host controller process 602, when the memory host controller 102 determines that the erase operation is auto-suspended, the memory host controller 102 initiates another memory operation (block 620). In the illustrated example, the memory host controller initiates the other memory operation by sending a memory operation command to the memory device 104 during an auto-suspended state of the erase operation. For example, the memory host controller 102 can determine that the erase operation is auto-suspended based on reading the status register 174 (FIG. 1B) of the memory device 104. Example values of the status register bits SR[7], SR[6], SR[2], SR[0] shown in FIG. 5 as SR[7]=1, SR[6]=1, SR[2]=1, SR[0]=0 indicate that the memory device 104 is in a 'device ready' state during an erase operation being auto erase-suspended successfully such that the memory device 104 can receive another memory command from the memory host controller 102 to perform another memory operation (e.g., a read operation, a write operation, etc.). In other examples, the memory host controller 102 can determine when the erase operation is auto-suspended by maintaining a local timer or counter in the memory host controller 102 that the memory host controller 102 uses to track when the memory device 104 auto suspends erase operations.

In the example memory device process 604, the memory device 104 performs another memory operation (block 622). For example, the memory device 104 performs the other memory operation in response to receiving the memory operation command sent the memory host controller 102 at block 620. In some examples, the memory host controller 102 sends two or more memory operation commands to the memory device 104 at block 620, and the memory device 104 performs one or more corresponding memory operations based on the received one or more memory operation commands.

In the example memory host controller process 602, when the memory host controller 102 determines that the other memory operation(s) is/are complete, the memory host controller 104 initiates resumption of the erase operation (block 624). In the illustrated example, the memory host controller 102 initiates resumption of the erase operation by sending a subsequent erase command to the memory device 104. For example, the memory host controller 102 can obtain a status of the other one or more memory operations from the status register 174 of the memory device 104, and can send the subsequent erase command to the memory device 104 to initiate resumption of the erase operation when the status register 174 indicates that the one or more memory operations have completed. Example values of the status register bits SR[7], SR[6], SR[2], SR[0] shown in FIG. 5 as SR[7]=1, SR[6]=1, SR[2]=1, SR[0]=0 indicate that the memory device 104 is in a 'device ready' state during an erase operation being auto erase-suspended successfully such that the memory device 104 can receive another memory command from the memory host controller 102 to perform another memory operation (e.g., receive an erase command to resume the auto erase-suspended erase operation). Alternatively, the memory host controller 102 can maintain a timer or counter to track an amount of time expected for completion of the one or more memory operations and, upon expiration of the expected amount of time, the memory host controller 102 can send the subsequent erase command to initiate the resumption of the erase operation in the memory device 104.

In the example memory device process 604, the memory device 104 resumes the erase operation (block 626). For example, the memory device 104 can resume the erase operation in response to receiving the subsequent erase command sent by the memory host controller 102 at block 624. An example process that may be used to implement block 626 to resume the erase operation is described below in connection with FIG. 8.

In the illustrated example, after the memory host controller 102 initiates resumption of the erase operation at block 624, the example memory host controller process 602 ends. Similarly in the illustrated example, after the memory device 104 resumes the erase operation at block 626, the example memory device process 604 ends. However, the example memory host controller 102 may perform one or more additional iterations of the example memory host controller process 602, and the example memory device 104 may perform one or more additional iterations of the example memory device process 604 to complete further erase segments of an erase operation and/or to perform subsequently requested erase operations using the auto erase-suspend feature.

Figure 7:
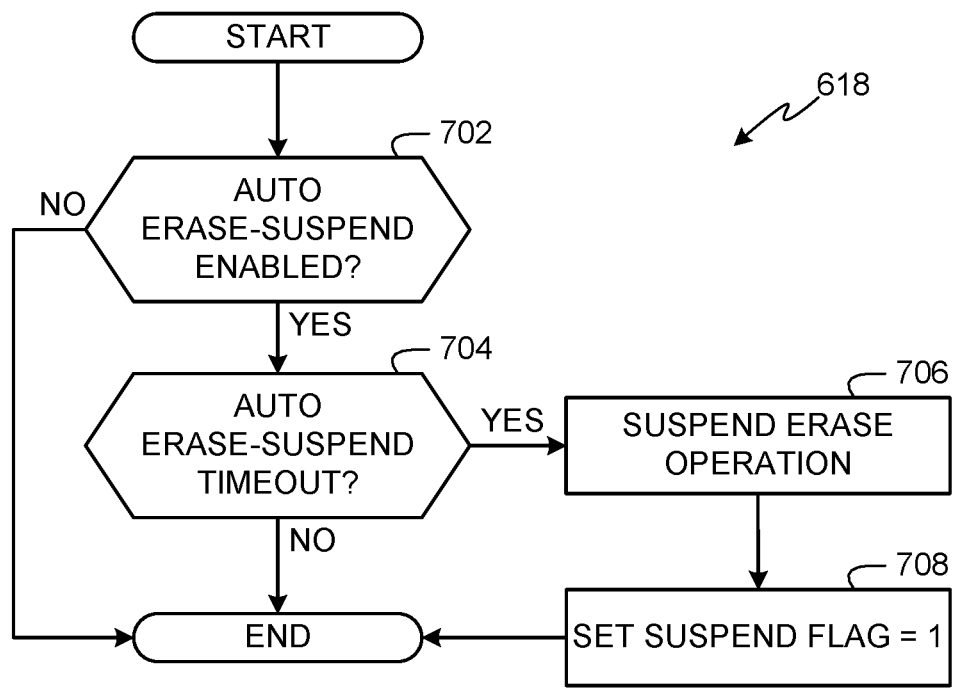
FIG. 7 is an example flow diagram representative of machine readable instructions that may be executed to suspend an erase operation using an auto erase-suspend feature.

FIG. 7 is an example flow diagram representative of machine readable instructions that may be executed by the memory device 104 (FIGS. 1A and 1B) to suspend an ongoing erase operation using an auto erase-suspend feature. The example process 618 of FIG. 7 may be used to implement the operation of block 618 FIG. 6. The example process 618 of FIG. 7 begins when the memory device 104 determines whether an auto erase-suspend feature is enabled (block 702). For example, the memory device 104 determines that the auto erase-suspend feature is enabled when the erase-suspend enable setting 106 is set (e.g., the erase-suspend enable setting 106 is equal to one (1)). When the memory device 104 determines that the auto erase-suspend feature is enabled, the memory device 104 determines whether an auto erase-suspend timeout has been reached (block 704). For example, the memory device 104 can determine whether the auto erase-suspend timeout has been reached based on whether the erase segment duration value 108 is satisfied by (e.g., is less than or equal to) an amount of time that has elapsed relative to the start of an ongoing erase operation or relative to a most recent resumption of the ongoing erase operation.

When the example memory device 104 determines that the auto erase-suspend timeout has been reached (block 704), the memory device 104 suspends the erase operation (block 706). In addition, the example memory device 104 sets a suspend flag to one (e.g., SUSPEND_FLAG=1) (block 708). For example, the memory device 104 can set the suspend flag equal to one by setting the second status register bit (SR[2]) in the status register 174 equal to one in the status register 174 (FIG. 1B). After setting the suspend flag to one at block 708, or if the memory device 104 determines at block 702 that the auto erase-suspend feature is not enabled, or if the memory device 104 determines at block 704 that the auto erase-suspend timeout has not been reached, the example process 618 of FIG. 7 ends.

Figure 8:
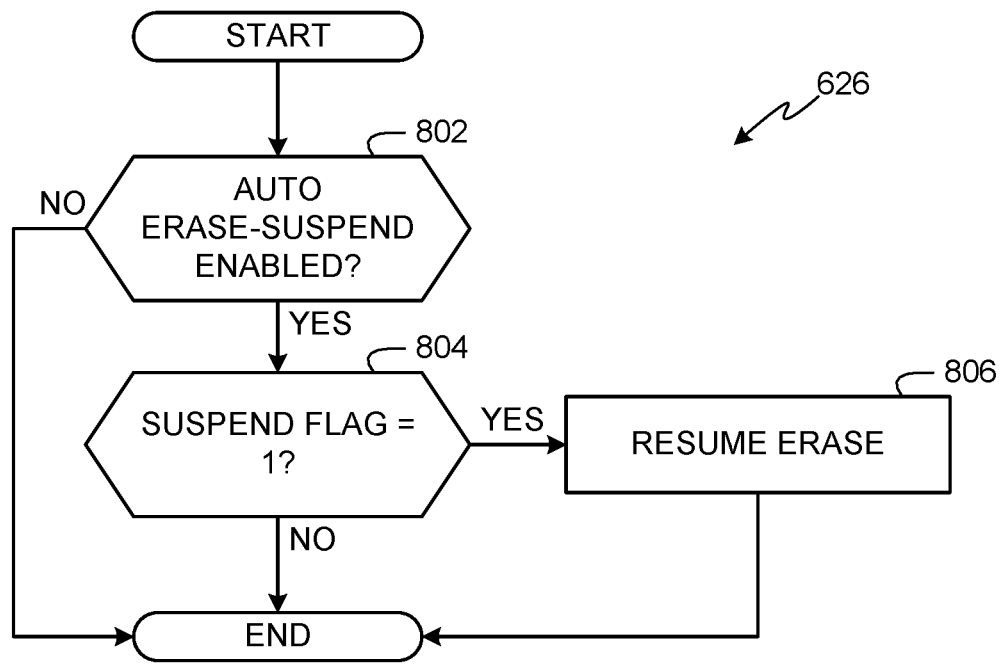
FIG. 8 is an example flow diagram representative of machine readable instructions that may be executed to resume an erase operation from an auto-suspended state.

FIG. 8 is an example flow diagram representative of machine readable instructions that may be executed by the example memory device 104 (FIGS. 1A and 1B) to resume an erase operation in an auto erase-suspended state. The example process 626 of FIG. 8 may be used to implement block 626 of FIG. 6 to resume an erase operation after the memory device 104 receives a subsequent erase command from the memory host controller 104. The example process 626 of FIG. 8 begins when the memory device 104 determines whether an auto erase-suspend feature is enabled (block 802). When the auto erase-suspend feature is enabled, the memory device 104 determines whether a suspend flag is set equal to one (block 804). For example, the memory device 104 may check the value of the suspend flag (e.g., the second status register bit (SR[2]) in the status register 174). When the memory device 104 determines that the suspend flag is set equal to one, the memory device 104 resumes the erase operation (block 806). After the memory device 104 resumes the erase operation at block 806, or if at block 804 the memory device 104 determines that the suspend flag is not equal to one, or if at block 802 the memory device 104 determines that the auto erase-suspend feature is not enabled, the example process 626 of FIG. 8 ends.

Figure 9:
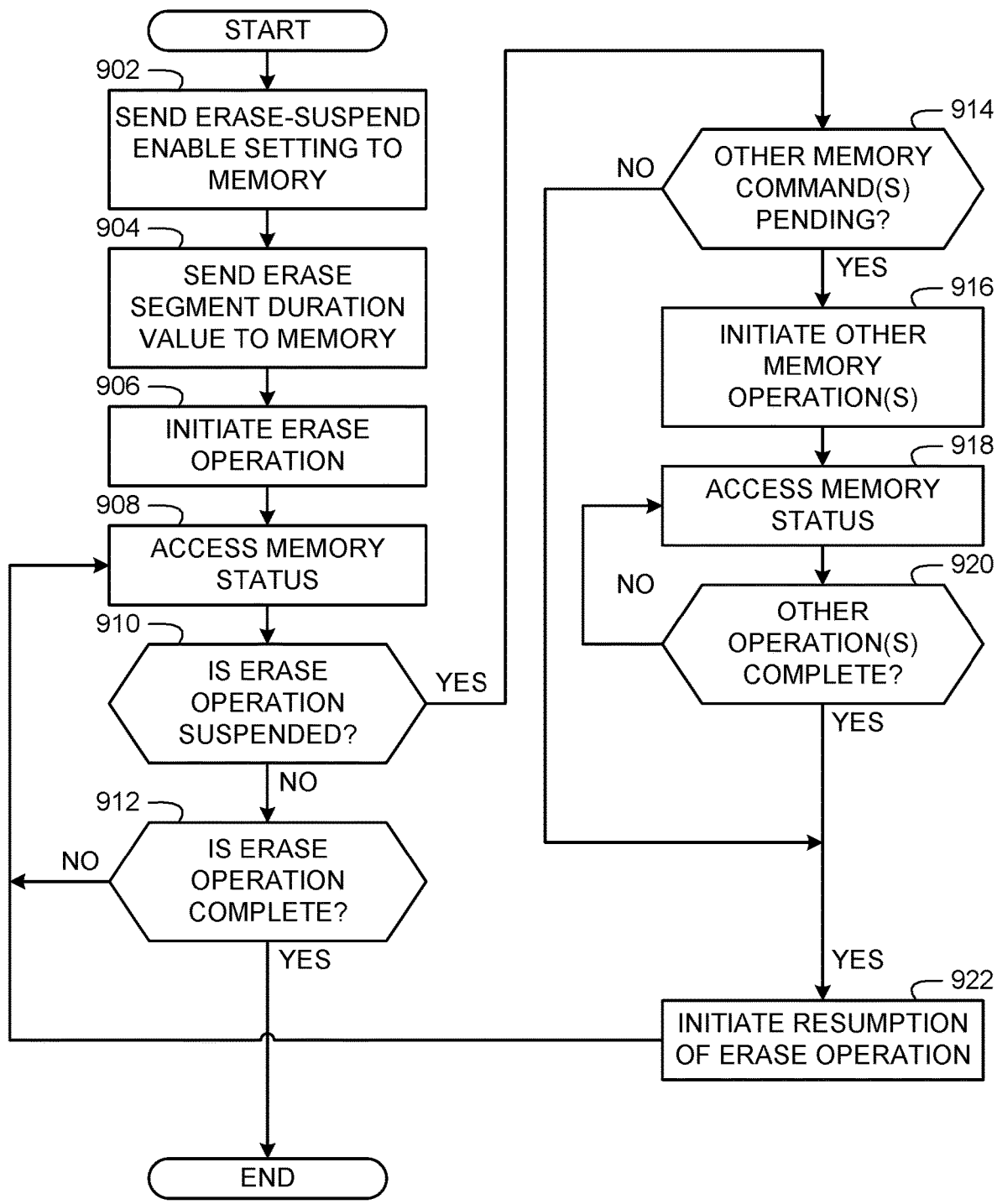
FIG. 9 is a flow diagram representative of machine readable instructions that may be executed by the example memory host controller of FIGS. 1A and 1B to implement an auto erase-suspend operation in accordance with the teachings of this disclosure.

FIG. 9 is a flow diagram representative of machine readable instructions that may be executed by the example memory host controller 102 to implement an auto erase-suspend operation in accordance with the teachings of this disclosure. The example process of FIG. 9 begins at block 902 when the memory host processor 154 (FIG. 1B) sends the erase-suspend enable setting 106 (FIG. 1B) to the memory device 104. For example, the memory host processor 154 may send the erase-suspend enable setting 106 to the memory device 104 via the memory interface 162 (FIG. 1B) to enable an auto erase-suspend feature in the memory device 104. The example memory host processor 154 sends the erase segment duration value 108 (FIG. 1B) to the memory device 104 (block 904). For example, the memory host processor 154 may send the erase segment duration value 108 via the memory interface 162.

The example memory host processor 154 initiates an erase operation (block 906). For example, the CPU host interface 152 may receive an erase request from the CPU host processor 150 and store a corresponding erase command in the command queue 156. The example memory host processor 154 may then send the erase command from the command queue 156 to the memory device 104 via the memory interface 162. Since the memory device 104 has been configured to perform erase operations using the auto erase-suspend feature, the memory device 104 performs the erase operation as a plurality of erase segments (e.g., the erase segments 213, 214, 215, 216, 217, 218, 219 of FIG. 2) and will suspend the erase operation between the erase segments.

The example memory interface 162 accesses the memory status of the memory device 104 (block 908). For example, the memory host processor 154 may send a request via the memory interface 162 to the memory device 104 to obtain the status bits of the status register 174 of the memory device 104. The example memory host processor 154 determines whether the erase operation is auto-suspended (block 910). If the erase operation is not auto suspended, the memory host processor 154 determines whether the erase operation is complete (block 912). For example, the memory host processor 154 may determine the auto suspended state of the erase operation and or the completion state of the erase operation based on the status bits received at block 908 from the status register 174. If the erase operation is not complete (block 912), control returns to block 908 at which the memory interface 162 accesses the memory status again to continue monitoring a status of the erase operation at the memory device 104.

If the example memory host processor 154 determines that the erase operation is auto-suspended at the memory device (block 910), control advances to block 914 at which the memory host processor 154 determines whether one or more other memory operation command(s) is/are pending in the command queue 156. If one or more other memory operation command(s) is/are pending, the memory host processor 154 initiates the other memory operation(s) (block 916). For example, the memory host processor 154 can send the one or more other memory operation command(s) from the command queue 156 to the memory device 104 via the memory interface 162.

The example memory host processor 154 then accesses the memory status of the memory (block 918). For example, the memory host processor 154 may send a request via the memory interface 162 to the memory device 104 to obtain the status bits of the status register 174 of the memory device 104. The example memory host processor 154 determines whether the other memory operation(s) is/are complete (block 920). For example, the memory host processor 154 may determine whether the other memory operation(s) is/are complete based on the status bits received at block 918 from the status register 174. In some examples, the memory host controller 102 can perform multiple iterations of block 914, block 916, block 918, and block 920 to initiate multiple memory operations in the memory device 104 during an auto-suspended state based on multiple memory operation commands pending in the command queue 156.

If the memory host processor 154 determines that the other memory operation(s) is/are not complete, control returns to block 918 so that the memory host processor 154 can continue to monitor the status of the memory device 104. When the memory host processor 154 determines that the other memory operation(s) is/are complete (block 920), or when the memory host processor 154 determines that other memory operation command(s) is/are not pending in the command queue 156 (block 914), control advances to block 922 at which the memory host processor 154 initiates resumption of the erase operation (block 922). For example, the memory host processor 154 may resume the erase operation by sending a subsequent erase command to the memory device 104 via the memory interface 162. After initiating the resumption of the erase operation at block 922, control returns to block 908. When the memory host processor 154 determines at block 912 that the erase operation is complete, the example process of FIG. 9 ends.

Figure 10:
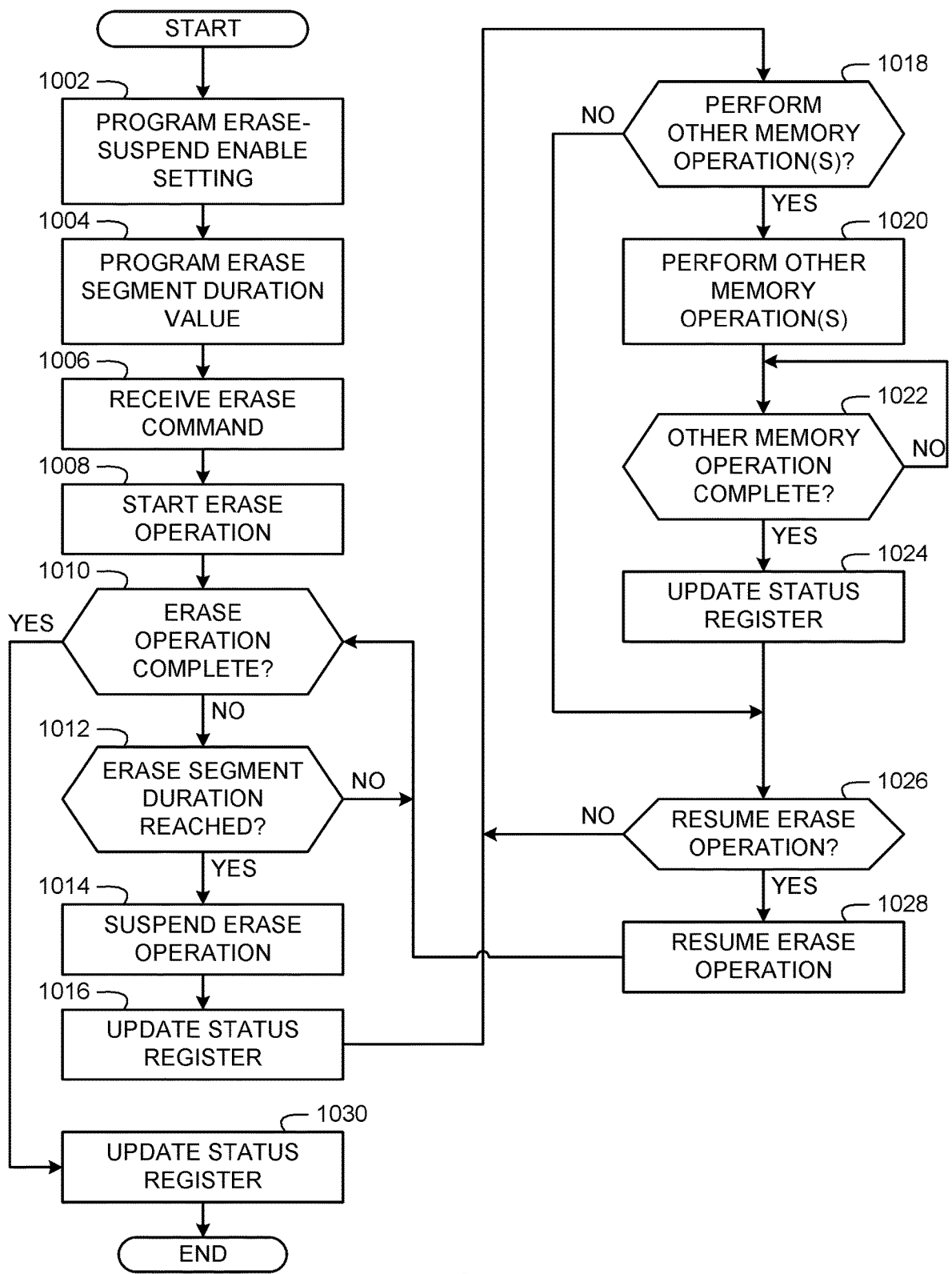
FIG. 10 is a flow diagram representative of machine readable instructions that may be executed by the example memory device of FIGS. 1A and 1B to implement an auto erase-suspend operation in accordance with the teachings of this disclosure.
Figure 11:
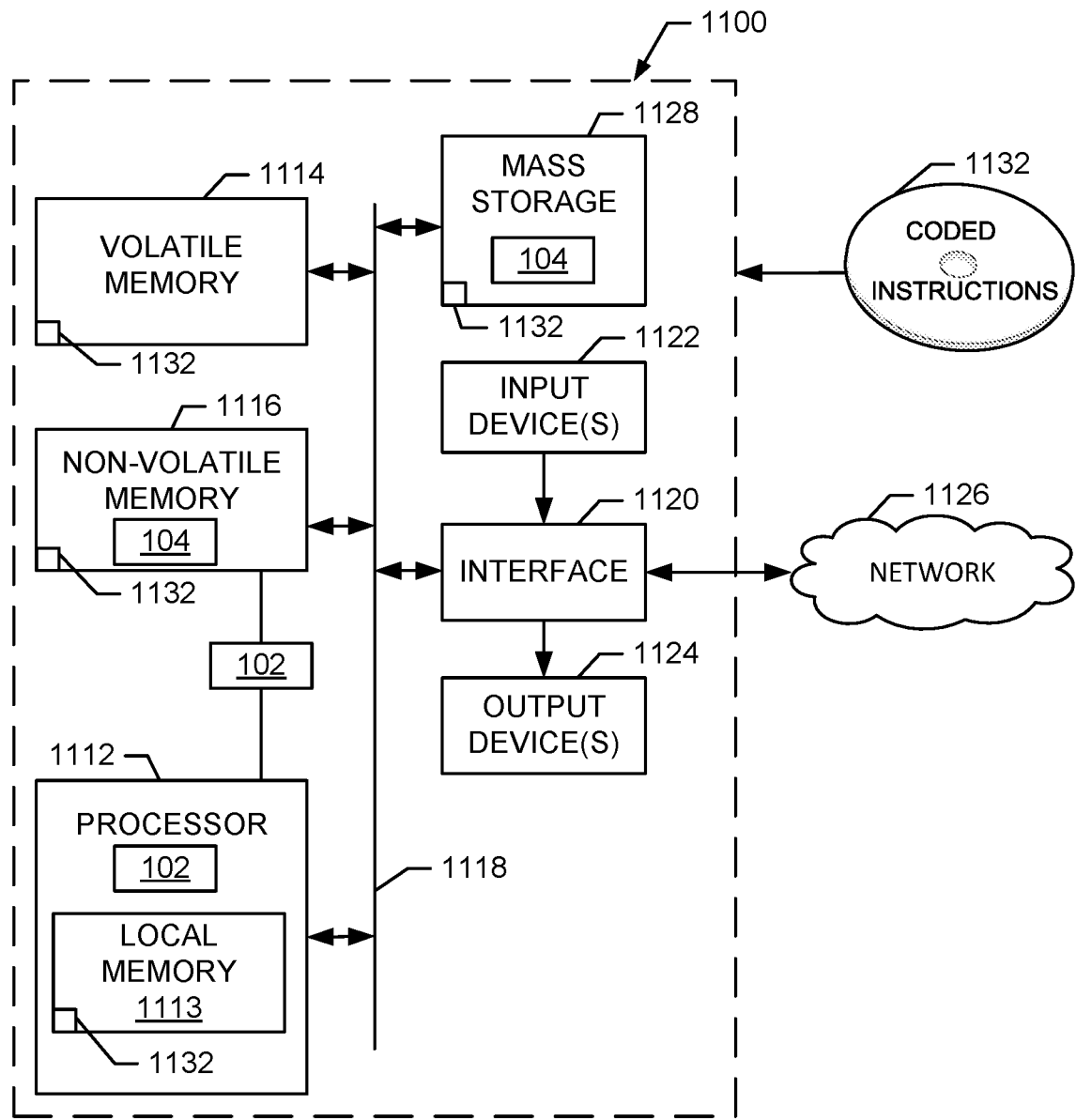
FIG. 11 is an example processor platform capable of executing the example computer readable instructions represented by FIGS. 6-10 to implement the example memory host controller and/or the example memory device of FIGS. 1A and 1B to perform auto erase-suspend operations in accordance with the teachings of this disclosure.

FIG. 10 is a flow diagram representative of machine readable instructions that may be executed by the example memory device 104 (FIGS. 1A and 1B) to implement an auto erase-suspend operation in accordance with the teachings of this disclosure. The example process of FIG. 10 begins at block 1002 when the control circuit 164 (FIG. 1B) programs the erase-suspend enable setting 106 in the feature set register 170 (FIG. 1B). For example, the control circuit 164 may receive the erase-suspend enable setting 106 from the memory host controller 102 via the host interface 172, and program the erase-suspend enable setting 106 in the feature set register 170 to configure the memory device 104 to perform auto erase-suspend operations when erase commands are subsequently received from the memory host controller 102.

At block 1004, the example control circuit 164 programs the erase segment duration value 108 in the trim set register 168 (FIG. 1B). For example, the control circuit 164 may receive the erase segment duration value 108 from the memory host controller 102 via the host interface 172, and program the erase segment duration value 108 in the trim set register 168 to configure the memory device 104 to determine when to auto-suspend erase operations based on the auto erase-suspend feature being enabled in the feature set register 170.

The host interface 172 subsequently receives an erase command (block 1006) from the memory host controller 102. The control circuit 164 starts an erase operation (block 1008). For example, the control circuit 164 may process the erase command from the host interface 172 and start the erase operation on one corresponding memory block (e.g., in a single-plane erase operation) or multiple corresponding memory blocks (e.g., in a multi-plane erase operation) in the memory cell array 176 by dividing the erase operation into multiple erase segments (e.g., the erase segments 213, 214, 215, 216, 217, 218, 219 of FIG. 2) and auto-suspending the erase operation between the multiple erase segments. The example control circuit 154 subsequently determines whether the erase operation is complete (block 1010). For example, an erase operation may be shorter in time than the erase segment duration value 108. In such instances, the short erase operation completes without being auto-suspended based on the auto erase-suspend feature enabled in the feature set register 170.

If the erase operation is not complete, the example control circuit 164 determines whether an erase segment duration has been reached (block 1012). For example, the control circuit 164 can use the example comparator 180 (FIG. 1B) to compare the erase segment duration value 108 from the trim set register 168 with an amount of time tracked by the timing circuit 178 that has lapsed since the start of the erase operation (or since a most recent resumption of the erase operation from a previous auto-suspend state). When the control circuit 164 determines that the erase segment duration has not been reached (block 1012), control returns to block 1010. However, when the control circuit 164 determines that the erase segment duration has been reached (block 1012), the control circuit 164 suspends the erase operation (block 1014). The example control circuit 164 updates the status register 174 (FIG. 1B) (block 1016). For example, the control circuit 164 sets the second status register bit (SR[2]) of the status register 174 to one.

The example control circuit 164 then determines whether to perform one or more other memory operation(s) (block 1018). For example, if the control circuit 164 receives one or more other memory operation command(s) (e.g., one or more read commands) from the memory host controller 102 via the host interface 172, the control circuit 164 determines that it is to perform one or more other memory operation(s) while the erase operation is auto-suspended. When the example control circuit 164 determines that it is to perform one or more other memory operation(s), the control circuit 164 performs the one or more other memory operation(s) (block 1020). The example control circuit 164 then determines whether the one or more other memory operation(s) is/are complete (block 1022). If the one or more other memory operations is/are not complete, example control circuit 164 continues to monitor for completion of the one or more other memory operations at block 1022. When the one or more other memory operations are complete, control advances to block 1024, at which the control circuit 164 updates the status register 174. For example, the control circuit 164 can update the status register 174 to indicate that the memory device 104 is ready to receive another memory operation command. In some examples, the control circuit 164 can perform multiple iterations of block 1018, block 1020, block 1022, and block 1024 to perform multiple memory operations in the memory device 104 during an auto-suspended state based on multiple memory operation commands received from the memory host controller 102.

After the control circuit updates the status register 174 at block 1024 or if the control circuit 164 determines at block 1018 that it is not to perform one or more other memory operation(s), control advances to block 1026 at which the control circuit 164 determines whether to resume the erase operation (block 1026). For example, the control circuit 164 can determine that it is to resume the erase operation if it receives a subsequent erase command from the memory host controller 102 via the host interface 172. If the control circuit 164 determines that it is not to resume the erase operation (block 1026), control returns to block 1018. However, if the control circuit 164 determines that it is to resume the erase operation (block 1026), the control circuit 164 resumes the erase operation (block 1028), and control returns to block 1010.

When the example control circuit 164 determines at block 1010 that an erase operation is complete, control advances to block 1030 at which the control circuit 164 updates the status register 174 (block 1030). For example, the control circuit 164 may clear the second status register bit (SR[2]) and the zeroth status register bit (SR[0]) to zero (0) in the status register 174 to indicate that the erase operation has completed with a pass status. Alternatively, if the erase operation completes with a fail status, the control circuit 164 may clear the second status register bit (SR[2]) to zero (0) and set the zeroth status register bit (SR[0]) to one (1). The example process of FIG. 10 then ends.

The computer readable instructions represented by the flow diagrams of FIGS. 6-10 may be embodied in firmware and/or software stored on a tangible computer readable storage medium such as a CD-ROM, a floppy disk, a hard drive, a digital versatile disk (DVD), a Blu-ray disk, or other memory and programmed in the example memory host controller 102 and the example memory device 104 of FIGS. 1A and 1B. Alternatively, the processes represented by the flow diagrams of FIGS. 6-10 and/or parts thereof could be embodied in the example memory host controller 102 and/or the example memory device 104 using dedicated hardware. Further, although the example programs are described with reference to the flow diagrams illustrated in FIGS. 6-10, many other methods of implementing the example memory host controller 102 and the example memory device 104 may alternatively be used. For example, the order of execution of the blocks may be changed, and/or some of the blocks described may be changed, eliminated, or combined.

As mentioned above, the example processes of FIGS. 6-10 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIGS. 6-10 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

FIG. 6 is a block diagram of an example processor platform 1100 capable of executing the instructions of FIGS. 6-10 to implement the example memory controller 102 and/or the example memory device 104 of FIGS. 1A and 1B to perform auto erase-suspend operations in accordance with the teachings of this disclosure. The processor platform 1100 can be, for example, a server, a personal computer, a mobile device (e.g., a cell phone, a smart phone, a tablet such as an iPad® tablet computer), a personal digital assistant (PDA), an Internet appliance, a DVD player, a CD player, a digital video recorder, a Blu-ray player, a gaming console, a personal video recorder, a set top box, or any other type of computing device.

The processor platform 1100 of the illustrated example includes a processor 1112. The processor 1112 of the illustrated example is hardware. For example, the processor 1112 can be implemented by one or more integrated circuits, logic circuits, microprocessors or controllers from any desired family or manufacturer.

The processor 1112 of the illustrated example includes a local memory 1113 (e.g., a cache). The processor 1112 of the illustrated example is in communication with a main memory including a volatile memory 1114 and a non-volatile memory 1116 via a bus 1118. The volatile memory 1114 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1116 may be implemented by flash memory and/or any other desired type of memory device. In some examples, the memory device 104 of FIGS. 1A and 1B may be implemented as part of the non-volatile memory 1116. Access to the main memory 1114, 1116 is controlled by a memory controller.

In the illustrated example, access to the memory 104 is controlled by the memory host controller 102, which may be implemented in the processor 1112 or may be implemented separate from the processor 1112 and in circuit between the processor 1112 and the memory device 104. For example, the processor 1112 may implement the CPU host processor 150 of FIG. 1B.

The processor platform 1100 of the illustrated example also includes an interface circuit 1120. The interface circuit 1120 may be implemented by any type of interface standard, such as an Ethernet interface, a universal serial bus (USB), and/or a PCI express interface.

In the illustrated example, one or more input devices 1122 are connected to the interface circuit 1120. The input device(s) 1122 permit(s) a user to enter data and commands into the processor 1112. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1124 are also connected to the interface circuit 1120 of the illustrated example. The output devices 1124 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 1120 of the illustrated example, thus, typically includes a graphics driver card, a graphics driver chip or a graphics driver processor.

The interface circuit 1120 of the illustrated example also includes a communication device such as a transmitter, a receiver, a transceiver, a modem and/or network interface card to facilitate exchange of data with external machines (e.g., computing devices of any kind) via a network 1126 (e.g., an Ethernet connection, a digital subscriber line (DSL), a telephone line, coaxial cable, a cellular telephone system, etc.).

The processor platform 1100 of the illustrated example also includes one or more mass storage devices 1128 for storing software and/or data. Examples of such mass storage devices 1128 include floppy disk drives, hard drive disks, solid state drives (SSDs), compact disk drives, Blu-ray disk drives, RAID systems, and digital versatile disk (DVD) drives. In some examples, the memory device 104 of FIGS. 1A and 1B may implement a mass storage device 1128.

Coded instructions 1132 represented by the flow diagrams of FIGS. 6-10 may be stored in the mass storage device 1128, in the volatile memory 1114, in the non-volatile memory 1116, and/or on a removable tangible computer readable storage medium such as a CD or DVD, and may be programmed in the memory host controller 102 and/or the memory device 104 to be executed by the memory host controller 102 and/or the memory device 104.

From the foregoing, it will be appreciated that the above-disclosed methods, apparatus and articles of manufacture to implement auto erase-suspend operations are useful to increase throughput of memory devices by allowing other memory operations to be performed without needing to stall those memory operations until completion of an ongoing erase operation. For example, auto erase-suspend techniques disclosed herein are useful to prevent read and/or program/write operations from getting stalled/delayed behind erase operations that are potentially 100 times slower. Example auto erase-suspend techniques disclosed herein enable a memory device to operate autonomously to suspend an ongoing erase operation before the erase operation completes so that a memory host controller is allowed to request other memory operations to be performed by the memory device while the ongoing erase operation is suspended. Such disclosed auto erase-suspend techniques improve the operating performances of computing systems by allowing the computing systems to perform memory operations faster. In some implementations, performing memory operations faster can also reduce power requirements for battery operated devices because circuitry can be put into low power modes faster and more often by processing memory operations quicker and completing processing tasks in less time.

In addition, examples disclosed herein enable memory host controllers or SSD memory systems to effectively time slice an erase operation time and to allow high-priority read and/or program/write operations to complete faster than using prior erase techniques. In addition, resumption of auto-suspended erase operations as disclosed herein substantially decreases or eliminates the possibility of starvation of an erase operation that was suspended, and hides a substantial amount of the overhead associated with suspending and resumption of the erase operation.

The following pertain to further examples disclosed herein.

Example 1 is a method to use an erase-suspend feature with a memory device. The method of Example 1 includes sending, by a memory host controller, an erase-suspend enable setting and an erase segment duration value to the memory device, the erase-suspend enable setting to cause the memory device to perform an erase operation as a plurality of erase segments and to suspend the erase operation between the erase segments, and the erase segment duration value to specify a length of time for the erase segments; initiating, by the memory host controller, an erase operation to be performed at the memory device; when the erase operation is suspended, initiating, by the memory host controller, a second memory operation to be performed at the memory device; and after the memory host controller determines that the second memory operation is complete, initiating, by the memory host controller, resumption of the erase operation.

In Example 2, the subject matter of Example 1 can optionally include that the erase operation is suspended at the memory device based on the erase segment duration value being satisfied by an elapsed length of time for erasing one of the plurality of erase segments.

In Example 3, the subject matter any one of Examples 1-2 can optionally include that the initiating of the resumption of the erase operation is performed by the memory host controller sending an erase command to the memory device to resume the erase operation on a subsequent erase segment following the completed erase segment that finished before the suspending of the erase operation.

In Example 4, the subject matter of any one of Examples 1-3 can optionally include that the initiating of the second memory operation is performed by the memory host controller after determining from a status register value that the memory device has suspended the erase operation.

In Example 5, the subject matter of any one of Examples 1-4 can optionally include that the sending of the erase-suspend enable setting to the memory device is to program a feature set register of the memory device to cause the memory device to suspend the erase operation between the erase segments.

In Example 6, the subject matter of any one of Examples 1-5 can optionally include that the sending of the erase segment duration value to the memory device is to program a trim set register of the memory device.

In Example 7, the subject matter of any one of Examples 1-6 can optionally include that the sending of the erase-suspend enable setting and the erase segment duration value to the memory device is performed by the memory host controller during a power-up phase of the memory device.

In Example 8, the subject matter of any one of Examples 1-7 can optionally include that the sending of the erase-suspend enable setting and the erase segment duration value to the memory device is performed by the memory host controller during operation of the memory device when the memory host controller determines to change an erase-suspend configuration of the memory device between the erase-suspend feature being disabled and the erase-suspend feature being enabled.

In Example 9, the subject matter of any one of Examples 1-8 can optionally include determining when to change the erase-suspend configuration of the memory device based on memory commands pending in a command queue of the memory host controller.

Example 10 is an apparatus to use an erase-suspend feature with a memory device. The apparatus of Example 10 includes a memory interface to send an erase-suspend enable setting and an erase segment duration value to the memory device, the erase-suspend enable setting to cause the memory device to perform an erase operation as a plurality of erase segments and to suspend the erase operation between the erase segments, and the erase segment duration value to specify a length of time for the erase segments; and a memory host processor to initiate a second memory operation to be performed at the memory device when an erase operation is suspended; and after the second memory operation is complete, initiate resumption of the erase operation.

In Example 11 the subject matter of Example 10 can optionally include that the erase operation is suspended at the memory device based on the erase segment duration value being satisfied by an elapsed length of time for an erase of one of the plurality of erase segments.

In Example 12, the subject matter of any one of Examples 10-11 can optionally include that the memory host processor is to initiate the resumption of the erase operation by sending an erase command to the memory device to resume the erase operation on a subsequent erase segment following the completed erase segment that finished before the suspending of the erase operation.

In Example 13, the subject matter of any one of Examples 10-12 can optionally include that the memory host processor is to initiate the second memory operation after a determination from a status register value that the memory device has suspended the erase operation.

In Example 14, the subject matter of any one of Examples 10-13 can optionally include that the memory interface is to send the erase-suspend enable setting to the memory device to program a feature set register of the memory device, the programming of the feature set register paste on the erase-suspend enable setting is to cause the memory device to suspend the erase operation between the erase segments.

In Example 15, the subject matter of any one of Examples 10-14 can optionally include that the memory interface is to send the erase segment duration value to the memory device to program a trim set register of the memory device.

In Example 16, the subject matter of any one of Examples 10-15 can optionally include that the memory interface is to send the erase-suspend enable setting and the erase segment duration value to the memory device during a power-up phase of the memory device.

In Example 17, the subject matter of any one of Examples 10-16 can optionally include that the memory interface is to send the erase-suspend enable setting and the erase segment duration value to the memory device during operation of the memory device when the memory host processor determines to change an erase-suspend configuration of the memory device between the erase-suspend feature being disabled and the erase-suspend feature being enabled.

In Example 18, the subject matter of any one of Examples 10-17 can optionally include that the host processor is to determine when to change the erase-suspend configuration of the memory device based on memory commands pending in a command queue of a memory host controller.

In Example 19, the subject matter of any one of Examples 10-18 can optionally include one or more processors; a network interface in communication with the one or more processors; and a memory host controller in circuit with the one or more processors, the memory host controller including the memory interface and the memory host processor.

Example 20 is at least one article of manufacture including machine readable instructions that, when executed, cause a memory host controller to at least send an erase-suspend enable setting and an erase segment duration value to the memory device, the erase-suspend enable setting to cause the memory device to perform an erase operation as a plurality of erase segments and to suspend the erase operation between the erase segments, and the erase segment duration value to specify a length of time for the erase segments; initiate an erase operation to be performed at the memory device; when the erase operation is suspended, initiate a second memory operation to be performed at the memory device; and after the memory host controller determines that the second memory operation is complete, initiate resumption of the erase operation.

In Example 21, the subject matter of Example 20 can optionally include that the erase operation is suspended at the memory device based on the erase segment duration value being satisfied by an elapsed length of time for erasing one of the plurality of erase segments.

In Example 22, the subject matter of any one of Examples 20-21 can optionally include that the instructions are to cause the memory host controller to initiate the resumption of the erase operation by sending an erase command to the memory device to resume the erase operation on a subsequent erase segment following the completed erase segment that finished before the suspending of the erase operation.

In Example 23, the subject matter of any one of Examples 20-22 can optionally include that the instructions are to cause the memory host controller to initiate the second memory operation after determining from a status register value that the memory device has suspended the erase operation.

In Example 24, the subject matter of any one of Examples 20-23 can optionally include that the instructions are to cause the memory host controller to send the erase-suspend enable setting to the memory device to program a feature set register of the memory device, the programming of the feature set register based on the erase-suspend enable setting is to cause the memory device to suspend the erase operation between the erase segments.

In Example 25, the subject matter of any one of Examples 20-24 can optionally include that the instructions are to cause the memory host controller to send the erase segment duration value to the memory device to program a trim set register of the memory device.

In Example 26, the subject matter of any one of Examples 20-25 can optionally include that the instructions are to cause the memory host controller to send the erase-suspend enable setting and the erase segment duration value to the memory device during a power-up phase of the memory device.

In Example 27, the subject matter of any one of Examples 20-26 can optionally include that the instructions are to cause the memory host controller to send the erase-suspend enable setting and the erase segment duration value to the memory device during operation of the memory device when the memory host controller determines to change an erase-suspend configuration of the memory device between the erase-suspend feature being disabled and the erase-suspend feature being enabled.

In Example 28, the subject matter of any one of Examples 20-27 can optionally include that the instructions are further to cause the memory host controller to determine when to change the erase-suspend configuration of the memory device based on memory commands pending in a command queue of the memory host controller.

Example 29 is an apparatus to use an erase-suspend feature with a memory device. The apparatus of Example 29 includes first means for sending an erase-suspend enable setting and an erase segment duration value to the memory device, the erase-suspend enable setting to cause the memory device to perform an erase operation as a plurality of erase segments and to suspend the erase operation between the erase segments, and the erase segment duration value to specify a length of time for the erase segments; and second means for initiating a second memory operation to be performed at the memory device when an erase operation is suspended; and after the second memory operation is complete, initiating resumption of the erase operation.

In Example 30, the subject matter of Example 29 can optionally include that the erase operation is suspended at the memory device based on the erase segment duration value being satisfied by an elapsed length of time for erasing one of the plurality of erase segments.

In Example 31, the subject matter of any one of Examples 29-30 can optionally include that the second means is for initiating the resumption of the erase operation by sending an erase command to the memory device to resume the erase operation on a subsequent erase segment following the completed erase segment that finished before the suspending of the erase operation.

In Example 32, the subject matter of any one of Examples 29-31 can optionally include that the second means is for initiating the second memory operation after determining from a status register value that the memory device has suspended the erase operation.

In Example 33, the subject matter of any one of Examples 29-32 can optionally include that the first means is for sending the erase-suspend enable setting to the memory device to program a feature set register of the memory device, the programming of the feature set register paste on the erase-suspend enable setting is to cause the memory device to suspend the erase operation between the erase segments.

In Example 34, the subject matter of any one of Examples 29-33 can optionally include that the first means is for sending the erase segment duration value to the memory device to program a trim set register of the memory device.

In Example 35, the subject matter of any one of Examples 29-34 can optionally include that the first means is for sending the erase-suspend enable setting and the erase segment duration value to the memory device during a power-up phase of the memory device.

In Example 36, the subject matter of any one of Examples 29-35 can optionally include that the first means is for sending the erase-suspend enable setting and the erase segment duration value to the memory device during operation of the memory device when the second means determines to change an erase-suspend configuration of the memory device between the erase-suspend feature being disabled and the erase-suspend feature being enabled.

In Example 37, the subject matter of any one of Examples 29-36 can optionally include that the second means is for determining when to change the erase-suspend configuration of the memory device based on memory commands pending in a command queue of a memory host controller.

In Example 38, the subject matter of any one of Examples 29-37 can optionally include one or more processors; a network interface in communication with the one or more processors; and a memory host controller in circuit with the one or more processors, the memory host controller including the first means and the second means.

Example 39 is a method to use an erase-suspend feature on a memory device. The method of Example 39 includes starting, at the memory device, an erase operation; based on the erase-suspend feature being enabled at the memory device, suspending the erase operation based on the memory device determining that a length of time equal to an erase segment duration value has elapsed, the length of time elapsed being relative to a start of an erase segment, and the erase segment duration value specified in a configuration parameter for the erase-suspend feature; performing, by the memory device, a second memory operation when the erase operation is suspended; and after the second memory operation is complete, resuming the erase operation based on receiving an erase command from the memory host controller.

In Example 40, the subject matter of Example 39 can optionally include that the erase operation is started based on an erase command from a memory host controller.

In Example 41, the subject matter of any one of Examples 39-40 can optionally include that the resuming of the erase operation is performed by resuming the erase operation on a subsequent erase segment following the erase segment that finished before the suspending of the erase operation.

In Example 42, the subject matter of any one of Examples 39-41 can optionally include receiving an erase-suspend enable setting and the erase segment duration value at the memory device, the erase-suspend enable setting to cause the memory device to perform the erase operation as a plurality of erase segments and to suspend the erase operation between the erase segments.

In Example 43, the subject matter of any one of Examples 39-42 can optionally include programming a feature set register of the memory device based on the erase-suspend enable setting, and programming a trim set register of the memory device based on the erase segment duration value.

In Example 44, the subject matter of any one of Examples 39-43 can optionally include that the erase-suspend enable setting and the erase segment duration value are received at the memory device during a power-up phase of the memory device.

In Example 45, the subject matter of any one of Examples 39-44 can optionally include that the erase-suspend enable setting and the erase segment duration value are received at the memory device after the memory device has operated without the erase-suspend feature being enabled.

Example 46 is an apparatus to use an erase-suspend feature on a memory device. The apparatus of Example 46 includes a host interface to receive a first erase command to perform an erase operation; and a control circuit to, based on the erase-suspend feature being enabled at the memory device, suspend the erase operation based on determining that a length of time equal to an erase segment duration value has elapsed, the length of time elapsed being relative to a start of an erase segment, and the erase segment duration value specified in a configuration parameter for the erase-suspend feature; perform a second memory operation when the erase operation is suspended; and after the second memory operation is complete, resume the erase operation based on receiving a second erase command from the memory host controller.

In Example 47, the subject matter of Example 46 can optionally include that the host interface is to receive the first erase command from a memory host controller.

In Example 48, the subject matter of any one of Examples 46-47 can optionally include that the control circuit is to resume the erase operation on a subsequent erase segment following the erase segment that finished before the suspending of the erase operation.

In Example 49, the subject matter of any one of Examples 46-48 can optionally include that the host interface is further to receive an erase-suspend enable setting and the erase segment duration value, the erase-suspend enable setting to cause the memory device to perform the erase operation as a plurality of erase segments and to suspend the erase operation between the erase segments.

In Example 50, the subject matter of any one of Examples 46-49 can optionally include a feature set register to store the erase-suspend enable setting, and a trim set register to store the erase segment duration value.

In Example 51, the subject matter of any one of Examples 46-50 can optionally include that the erase-suspend enable setting and the erase segment duration value are received by the host interface during a power-up phase of the memory device.

In Example 52, the subject matter of any one of Examples 46-51 can optionally include that the erase-suspend enable setting and the erase segment duration value are received by the host interface after the memory device has operated without the erase-suspend feature being enabled.

In Example 53, the subject matter of any one of Examples 46-52 can optionally include one or more processors; a network interface in communication with the one or more processors; and the memory device in circuit with the one or more processors, the memory device including the host interface and the control circuit.

Example 54 is at least one article of manufacture including machine readable instructions that, when executed, cause a memory device to at least start an erase operation; based on the erase-suspend feature being enabled at the memory device, suspend the erase operation based on the memory device determining that a length of time equal to an erase segment duration value has elapsed, the length of time elapsed being relative to a start of an erase segment, and the erase segment duration value specified in a configuration parameter for the erase-suspend feature; perform a second memory operation when the erase operation is suspended; and after the second memory operation is complete, resume the erase operation based on receiving an erase command from the memory host controller.

In Example 55, the subject matter of Example 54 can optionally include that the instructions are to cause the memory device to start the erase operation based on an erase command from a memory host controller.

In Example 56, the subject matter of any one of Examples 54-55 can optionally include that the instructions are to cause the memory device to resume the erase operation on a subsequent erase segment following the erase segment that finished before the suspending of the erase operation.

In Example 57, the subject matter of any one of Examples 54-56 can optionally include that the instructions are further to cause the memory device to receive an erase-suspend enable setting and the erase segment duration value, the erase-suspend enable setting to cause the memory device to perform the erase operation as a plurality of erase segments and to suspend the erase operation between the erase segments.

In Example 58, the subject matter of any one of Examples 54-57 can optionally include that the instructions are further to cause the memory device to program a feature set register of the memory device based on the erase-suspend enable setting, and program a trim set register of the memory device based on the erase segment duration value.

In Example 59, the subject matter of any one of Examples 54-58 can optionally include that the instructions are to cause the memory device to receive the erase-suspend enable setting and the erase segment duration value during a power-up phase of the memory device.

In Example 60, the subject matter of any one of Examples 54-59 can optionally include that the instructions are to cause the memory device to receive the erase-suspend enable setting and the erase segment duration value after the memory device has operated without the erase-suspend feature being enabled.

Example 61 is an apparatus to use an erase-suspend feature on a memory device. The apparatus of Example 61 includes first means for receiving a first erase command to perform an erase operation; and second means for, based on the erase-suspend feature being enabled at the memory device, suspending the erase operation based on determining that a length of time equal to an erase segment duration value has elapsed, the length of time elapsed being relative to a start of an erase segment, and the erase segment duration value specified in a configuration parameter for the erase-suspend feature; performing a second memory operation when the erase operation is suspended; and after the second memory operation is complete, resuming the erase operation based on receiving a second erase command from a memory host controller.

In Example 62, the subject matter of Example 61 can optionally include that the first means is for receiving the first erase command from a memory host controller.

In Example 63, the subject matter of any one of Examples 61-62 can optionally include that the second means is for resuming the erase operation on a subsequent erase segment following the erase segment that finished before the suspending of the erase operation.

In Example 64, the subject matter of any one of Examples 61-63 can optionally include that the first means is further to receive an erase-suspend enable setting and the erase segment duration value, the erase-suspend enable setting to cause the memory device to perform the erase operation as a plurality of erase segments and to suspend the erase operation between the erase segments.

In Example 65, the subject matter of any one of Examples 61-64 can optionally include third means for storing the erase-suspend enable setting, and fourth means for storing the erase segment duration value.

In Example 66, the subject matter of any one of Examples 61-65 can optionally include that the erase-suspend enable setting and the erase segment duration value are received by the first means during a power-up phase of the memory device.

In Example 67, the subject matter of any one of Examples 61-66 can optionally include that the erase-suspend enable setting and the erase segment duration value are received by the first means after the memory device has operated without the erase-suspend feature being enabled.

In Example 68, the subject matter of any one of Examples 61-67 can optionally include one or more processors; a network interface in communication with the one or more processors; and the memory device in circuit with the one or more processors, the memory device including the first means and the second means.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus to use an erase-suspend feature on a memory device, the apparatus comprising:
    a host interface to receive a first erase command to perform an erase operation; and
    a control circuit to:
        based on the erase-suspend feature being enabled at the memory device, suspend the erase operation based on determining that (a) a length of time equal to an erase segment duration value has elapsed and (b) the erase operation has reached one of a plurality of suspend points associated with a block of memory to be erased, the length of time elapsed being relative to a start of an erase segment, and the erase segment duration value specified in a configuration parameter for the erase-suspend feature;
        perform a second memory operation when the erase operation is suspended; and
        after the second memory operation is complete, resume the erase operation based on receiving a second erase command.

2. An apparatus of claim 1, wherein the host interface is to receive the first erase command from a memory host controller.

3. An apparatus of claim 1, wherein the control circuit is to resume the erase operation on a subsequent erase segment following the erase segment that finished before the suspending of the erase operation.

4. An apparatus of claim 1, wherein the host interface is further to receive an erase-suspend enable setting and the erase segment duration value, the erase-suspend enable setting to cause the memory device to perform the erase operation as a plurality of erase segments and to suspend the erase operation between the erase segments.

5. An apparatus of claim 4, further including a feature set register to store the erase-suspend enable setting, and a trim set register to store the erase segment duration value.

6. An apparatus of claim 4, wherein the erase-suspend enable setting and the erase segment duration value are received by the host interface during a power-up phase of the memory device.

7. An apparatus of claim 4, wherein the erase-suspend enable setting and the erase segment duration value are received by the host interface after the memory device has operated without the erase-suspend feature being enabled.

8. An apparatus of claim 1, further including:
    one or more processors;
    a network interface in communication with the one or more processors; and
    the memory device in circuit with the one or more processors, the memory device including the host interface and the control circuit.

9. At least one article of manufacture comprising machine readable instructions that, when executed, cause a memory device to at least:
    start an erase operation;
    based on an erase-suspend feature being enabled at the memory device, suspend the erase operation based on determining that (a) a length of time equal to an erase segment duration value has elapsed and (b) the erase operation has reached one of a plurality of suspend points associated with a block of memory to be erased, the length of time elapsed being relative to a start of an erase segment, and the erase segment duration value specified in a configuration parameter for the erase-suspend feature;

perform a second memory operation when the erase operation is suspended; and after the second memory operation is complete, resume the erase operation based on receiving an erase command.

10. At least one article of manufacture of claim 9, wherein the instructions are to cause the memory device to start the erase operation based on a second erase command from a memory host controller before the erase command.

11. At least one article of manufacture of claim 9, wherein the instructions are to cause the memory device to resume the erase operation on a subsequent erase segment following the erase segment that finished before the suspending of the erase operation.

12. At least one article of manufacture of claim 9, wherein the instructions are further to cause the memory device to receive an erase-suspend enable setting and the erase segment duration value, the erase-suspend enable setting to cause the memory device to perform the erase operation as a plurality of erase segments and to suspend the erase operation between the erase segments.

13. At least one article of manufacture of claim 12, wherein the instructions are further to cause the memory device to program a feature set register of the memory device based on the erase-suspend enable setting, and program a trim set register of the memory device based on the erase segment duration value.

14. At least one article of manufacture of claim 12, wherein the instructions are to cause the memory device to receive the erase-suspend enable setting and the erase segment duration value during a power-up phase of the memory device.

15. At least one article of manufacture of claim 12, wherein the instructions are to cause the memory device to receive the erase-suspend enable setting and the erase segment duration value after the memory device has operated without the erase-suspend feature being enabled.

16. A method to use an erase-suspend feature on a memory device, the method comprising:

starting, at the memory device, an erase operation;

based on the erase-suspend feature being enabled at the memory device, suspending the erase operation based on determining that (a) a length of time equal to an erase segment duration value has elapsed and (b) the erase operation has reached one of a plurality of suspend points associated with a block of memory to be erased, the length of time elapsed being relative to a start of an erase segment, and the erase segment duration value specified in a configuration parameter for the erase-suspend feature;

performing, by the memory device, a second memory operation when the erase operation is suspended; and after the second memory operation is complete, resuming the erase operation based on receiving an erase command.

17. A method of claim 16, wherein the erase operation is started based on a second erase command from a memory host controller before the erase command.

18. A method of claim 16, wherein the resuming of the erase operation is performed by resuming the erase operation on a subsequent erase segment following the erase segment that finished before the suspending of the erase operation.

19. A method of claim 16, further including receiving an erase-suspend enable setting and the erase segment duration value at the memory device, the erase-suspend enable setting to cause the memory device to perform the erase operation as a plurality of erase segments and to suspend the erase operation between the erase segments.

20. A method of claim 19, further including programming a feature set register of the memory device based on the erase-suspend enable setting, and programming a trim set register of the memory device based on the erase segment duration value.

21. A method of claim 19, wherein the erase-suspend enable setting and the erase segment duration value are received at the memory device during a power-up phase of the memory device.

22. A method of claim 19, wherein the erase-suspend enable setting and the erase segment duration value are received at the memory device after the memory device has operated without the erase-suspend feature being enabled.

* * * * *